(12) United States Patent
Kamata

(10) Patent No.: US 9,147,481 B2
(45) Date of Patent: Sep. 29, 2015

(54) SEMICONDUCTOR MEMORY APPARATUS

(71) Applicant: KABUSHIKI KAISHA TOSHIBA, Minato-ku, Tokyo (JP)

(72) Inventor: Yoshihiko Kamata, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 54 days.

(21) Appl. No.: 13/842,876

(22) Filed: Mar. 15, 2013

(65) Prior Publication Data

US 2013/0286738 A1    Oct. 31, 2013

(30) Foreign Application Priority Data

Apr. 27, 2012  (JP) ................................ 2012-103644

(51) Int. Cl.
| | | |
|---|---|---|
| *G11C 16/26* | (2006.01) | |
| *G11C 16/04* | (2006.01) | |
| *G11C 16/28* | (2006.01) | |
| G11C 16/30 | (2006.01) | |

(52) U.S. Cl.
CPC ............ *G11C 16/26* (2013.01); *G11C 16/0483* (2013.01); *G11C 16/28* (2013.01); *G11C 16/30* (2013.01)

(58) Field of Classification Search
CPC ..................................................... G11C 16/26
USPC ................................................... 365/185.25
See application file for complete search history.

(56) References Cited

U.S. PATENT DOCUMENTS

| | | | |
|---|---|---|---|
| 5,909,393 A | | 6/1999 | Tran et al. |
| 2006/0133171 A1* | | 6/2006 | Tonda ........................... 365/210 |
| 2009/0103365 A1 | | 4/2009 | Roohparvar et al. |
| 2009/0168542 A1 | | 7/2009 | Hamada et al. |
| 2009/0273976 A1* | | 11/2009 | Maejima et al. ......... 365/185.05 |
| 2012/0069628 A1* | | 3/2012 | Ito ................................. 365/148 |

FOREIGN PATENT DOCUMENTS

| | | |
|---|---|---|
| JP | 10125087 A | 5/1998 |
| JP | 2003249083 A | 9/2003 |
| JP | 2006-134558 A | 5/2006 |
| JP | 2011501339 A | 1/2011 |

OTHER PUBLICATIONS

Japanese Office Action (and English translation thereof) dated May 12, 2015, issued in counterpart Japanese Application No. 2012-103644.

* cited by examiner

*Primary Examiner* — Min Huang
(74) *Attorney, Agent, or Firm* — Holtz, Holtz, Goodman & Chick PC

(57) ABSTRACT

According to one embodiment, a semiconductor memory apparatus includes an array, a source, a bit line, a sense, and current circuit. The array includes a NAND string. The NAND string includes memory cell. The sense includes a first transistor. One end of transistor is connected to a first node, and other end of the transistor is connected to a second. The first node is used for reading the data held by the memory cell. An internal voltage is smaller than the source voltage. The current circuit outputs a first voltage to a gate of the transistor, and the first voltage is smaller than the internal voltage. The transistor limits a first current from the source to the sense based on a threshold voltage of the memory cell to be read.

15 Claims, 13 Drawing Sheets

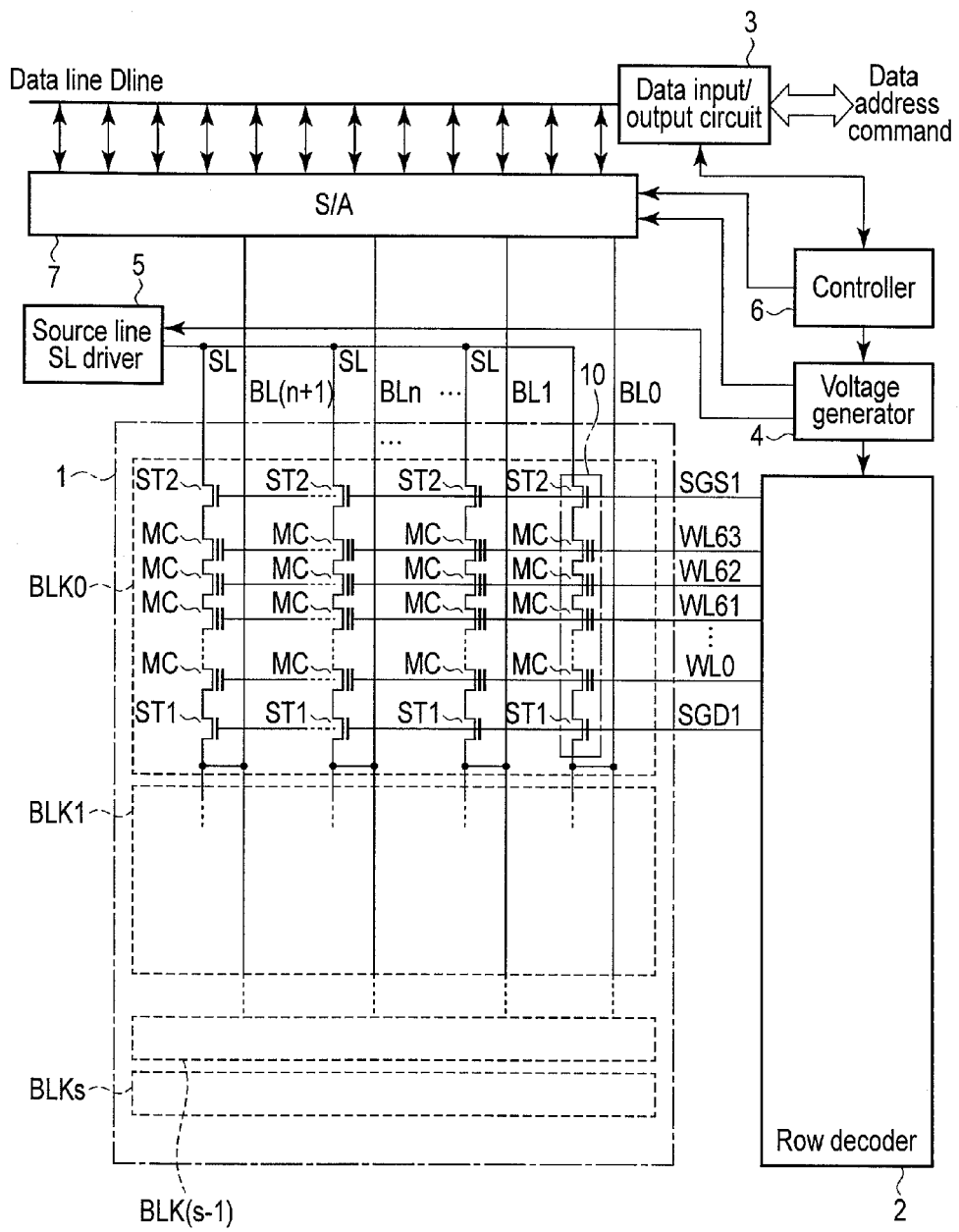
F I G. 1

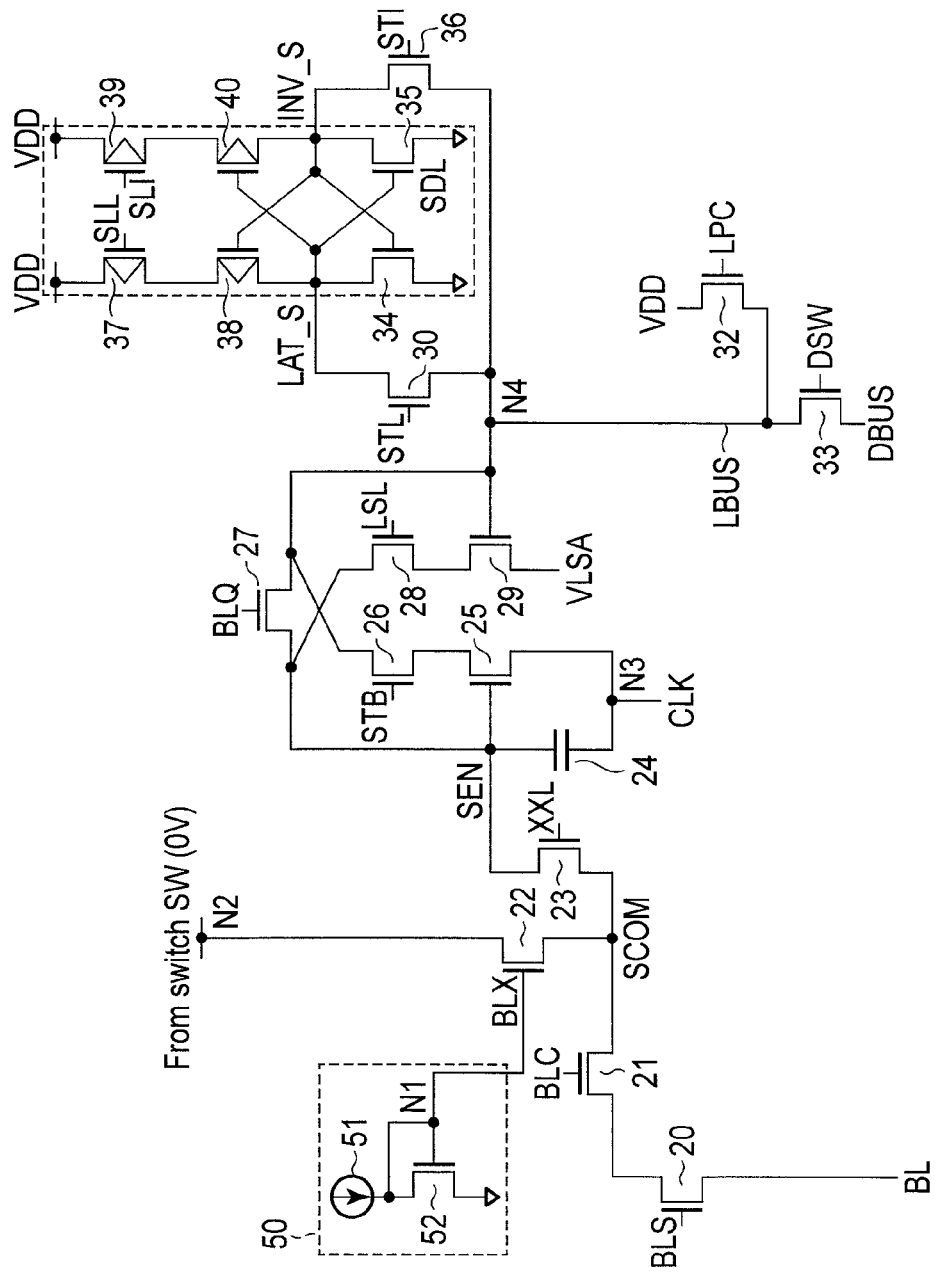
F I G. 5

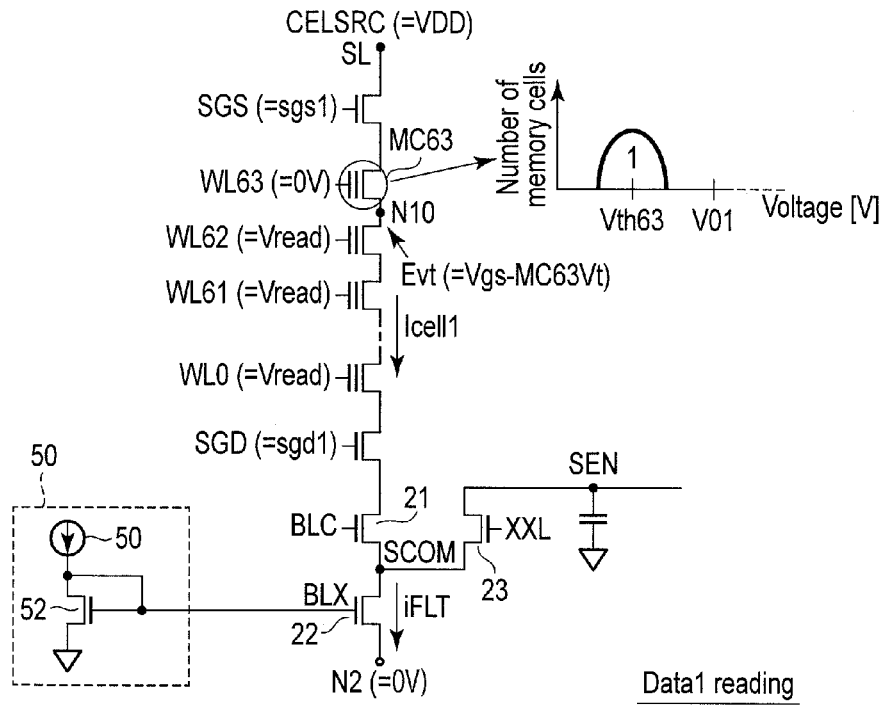
F I G. 8
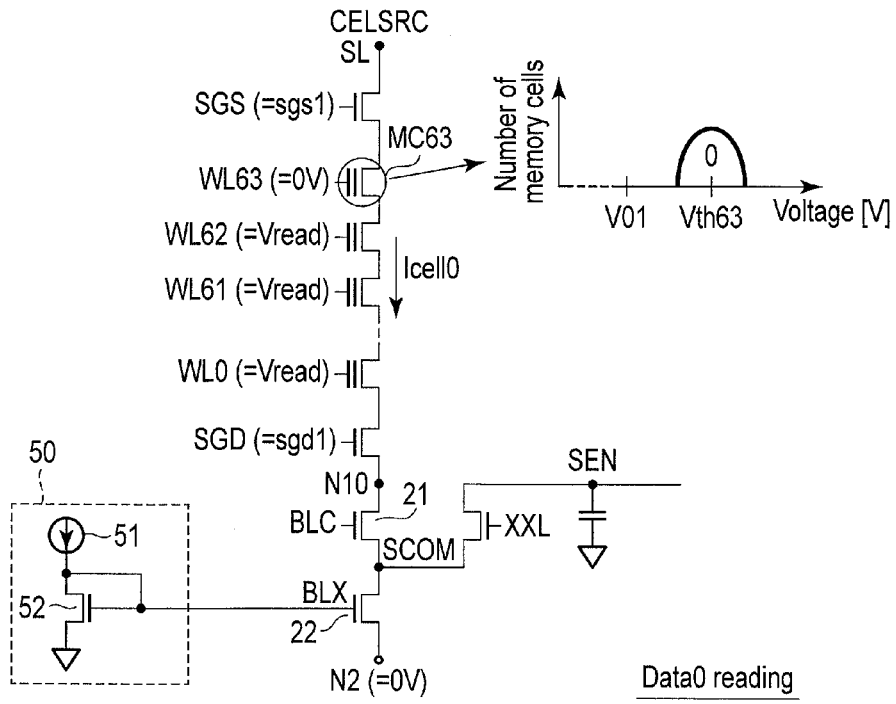
F I G. 9

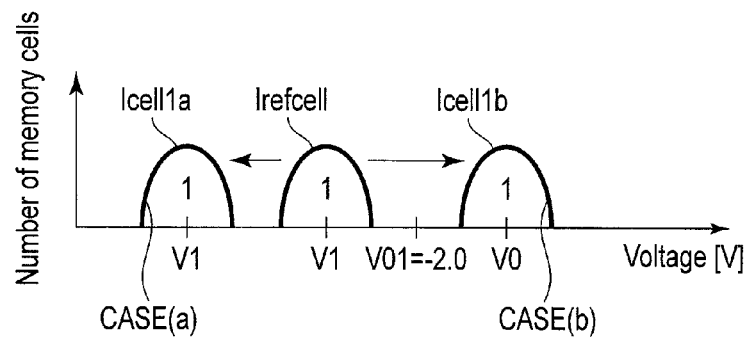
F I G. 12
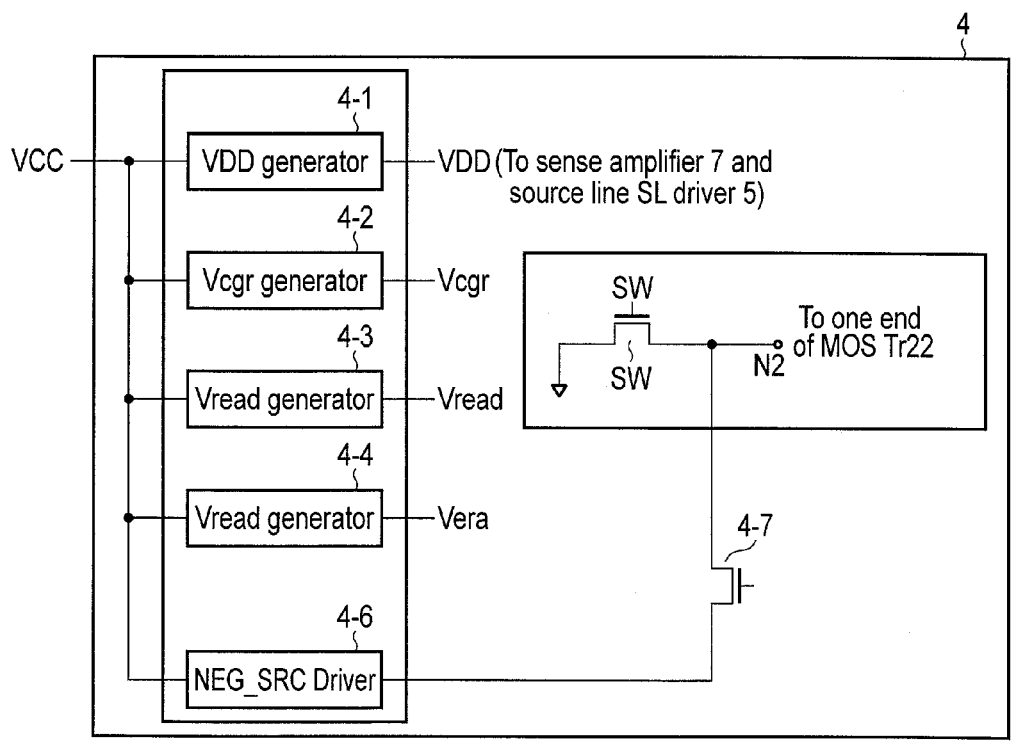
F I G. 13

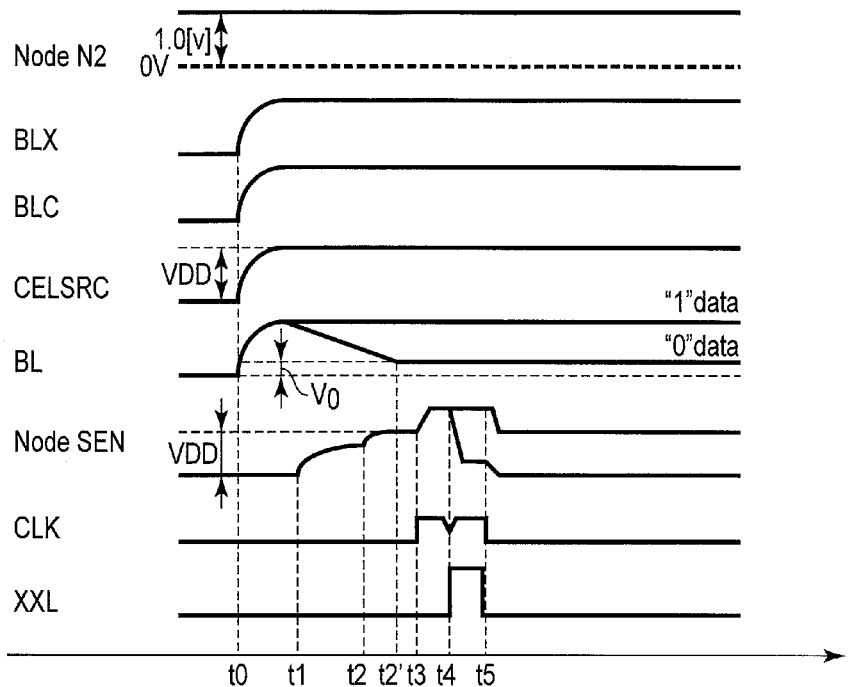
F I G. 14
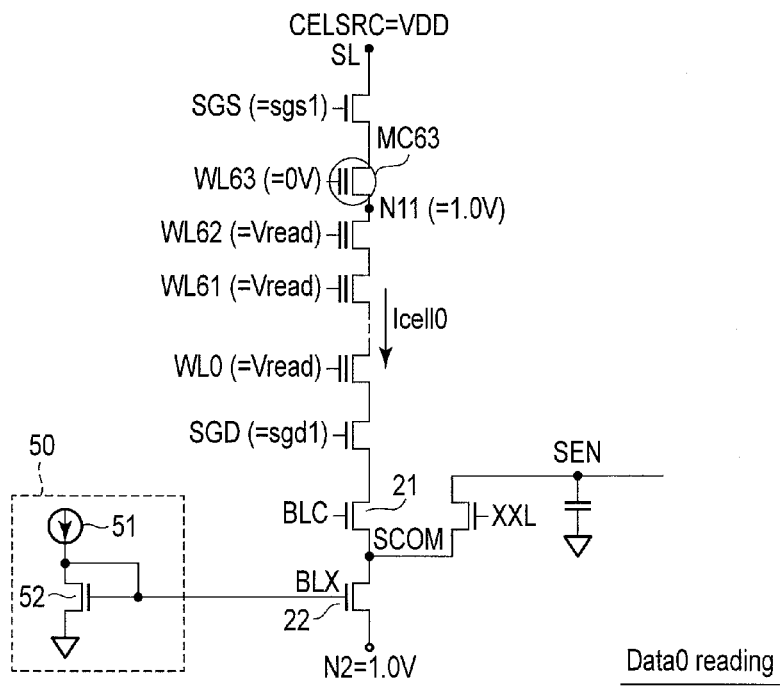
F I G. 15

| Selected word line WL | Distance l | Resistance R |
|---|---|---|
| WL0 | $l_0$ | $R_0$ |
| WL1 | $l_1$ | $R_1$ |
| | $\vdots$ | |
| WL1022 | $l_{1022}$ | $R_{1022}$ |
| WL1023 | $l_{1023}$ | $R_{1023}$ |
F I G. 16
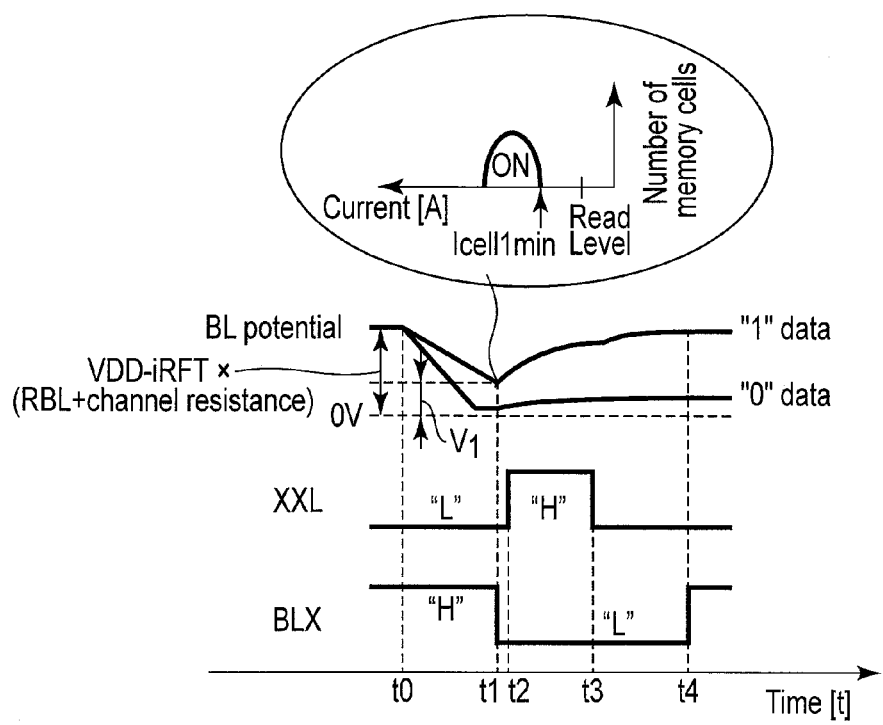
F I G. 18

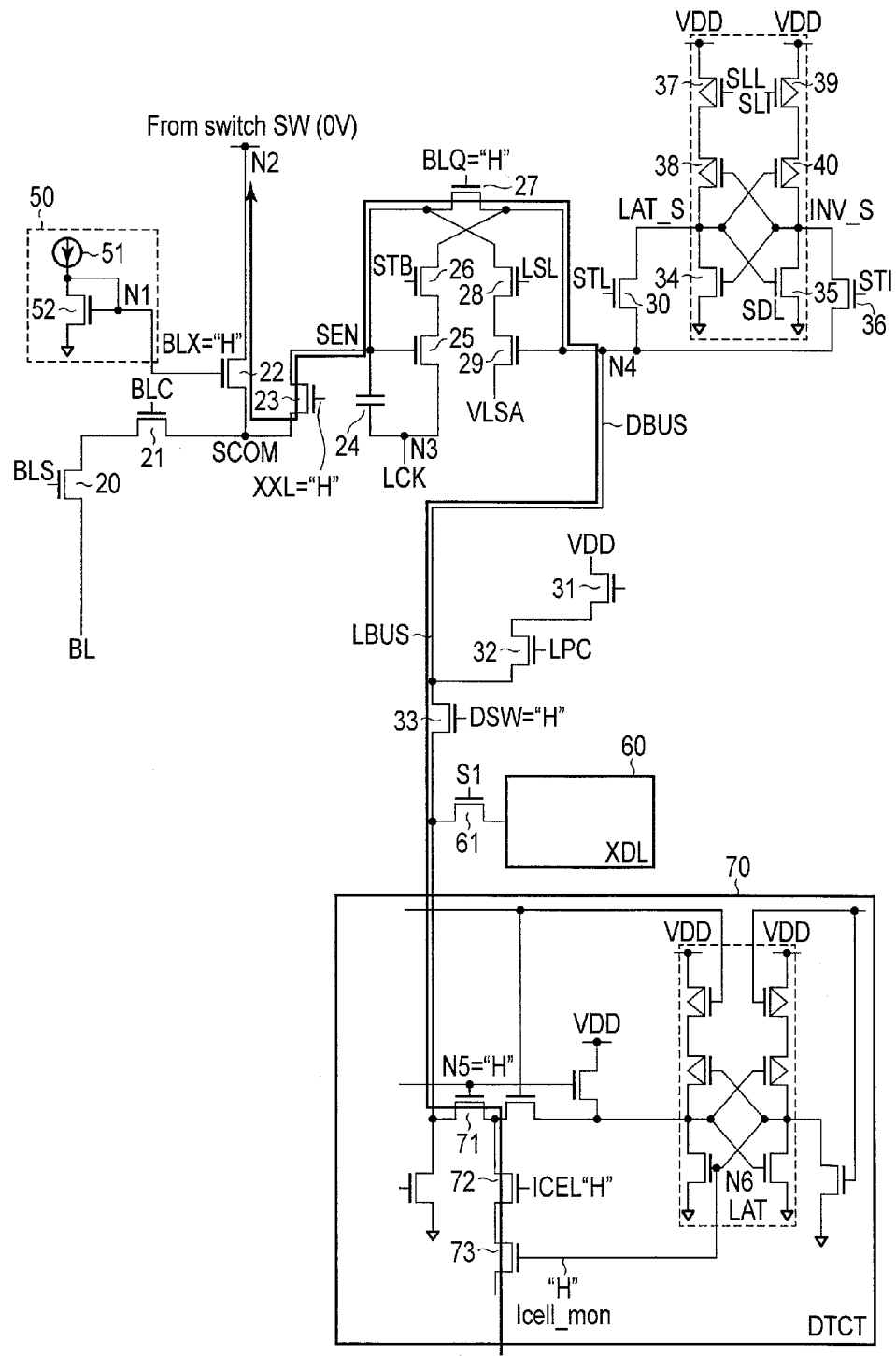
F I G. 21

SEMICONDUCTOR MEMORY APPARATUS

CROSS-REFERENCE TO RELATED APPLICATIONS

This application is based upon and claims the benefit of priority from Japanese Patent Application No. 2012-103644, filed Apr. 27, 2012, the entire contents of which are incorporated herein by reference.

FIELD

Embodiments described herein relate generally to a sense amplifier using a source follower sense (SFS) method.

BACKGROUND

The sense system may be divided into a system that detects the voltage of a bit line and a system that detects a current flowing through a bit line. In these sense systems, a method is known by which when a negative threshold of a memory cell is read, the voltage applied to the source side of the memory cell is raised to virtually apply a negative potential (voltage) to between gate and source of the memory cell.

BRIEF DESCRIPTION OF THE DRAWINGS

FIG. 1 is an overall configuration example of a semiconductor memory apparatus according to a first embodiment;

FIG. 5 is a configuration example of a sense amplifier according to the first embodiment;

FIG. 8 is a conceptual diagram showing the sense amplifier and a NAND string potential when "1" data according to the first embodiment is read;

FIG. 9 is a conceptual diagram showing the sense amplifier and the NAND string potential when "0" data according to the first embodiment is read;

FIG. 12 is a conceptual diagram showing the threshold distribution of memory cells according to the first modification of the first embodiment;

FIG. 13 is a block diagram of a voltage generator according to a second embodiment;

FIG. 14 is a time chart according to the second embodiment;

FIG. 15 is a conceptual diagram showing a sense amplifier and a NAND string potential when "1" data according to the second embodiment is read;

FIG. 16 is a block diagram of a controller according to a third embodiment;

FIG. 18 is a time chart showing a reading operation of "0", "1" data according to a fourth embodiment;

FIG. 21 is a conceptual diagram of a circuit diagram of a sense amplifier according to a fifth embodiment to measure threshold variations.

DETAILED DESCRIPTION

Figure 2:
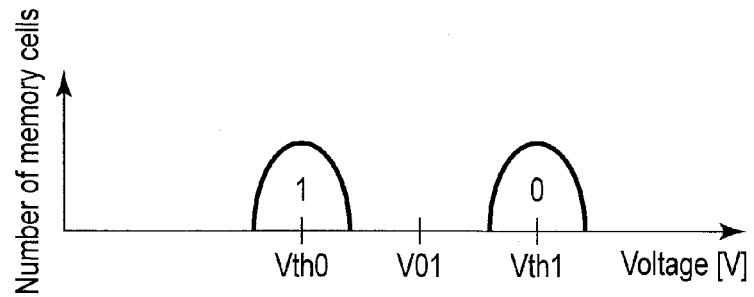
FIG. 2 is a conceptual diagram showing a threshold distribution of memory cells according to the first embodiment.

The present embodiment will be described below with reference to drawings. For the description, common reference numerals are attached to elements common to all drawings. However, note that the drawings are schematimayd the relationship between thickness and plane dimensions and the ratio of thickness of each layer are different from actual ones. Therefore, concrete thicknesses and dimensions should be determined by considering the description below. In addition, dimensional relationships or ratios may naturally be different from each other between drawings.

In general, according to one embodiment, a semiconductor memory apparatus includes a memory cell array, a source, a bit line, a sense amplifier, and current source circuit. The memory cell array includes a NAND string. The NAND string includes memory cell. The source is connected to the NAND string. The source voltage is supplied to the source. The bit line is connected to the NAND string. The sense amplifier includes a first transistor. One end of a current path of the first transistor is connected to a first node, and other end of the current path of the first transistor is connected to a second node. The first node is used for reading the data held by the memory cell. An internal voltage is supplied to the second node. The internal voltage is smaller than the source voltage. The current source circuit outputs a first voltage to a gate of the first transistor, and the first voltage is smaller than the internal voltage. When the data is read, a first transistor limit a first current from the source to the sense amplifier based on a threshold voltage of the memory cell to be read while a second voltage is supplied to the source.

It will be understood that when an element is referred to as being "electrically connected to" or "connected to" another element, it can be not only directly connected but also connected to the other element or intervening elements may be present.

First Embodiment

In the first embodiment, a semiconductor memory apparatus that reads data from all bit lines BL at the same time while performing source follower sense for reading data in a memory cell MC will be described.

1. Overall Configuration Example

An overall configuration example will be described by using FIG. 1. FIG. 1 is a block diagram exemplifying a NAND flash memory. As shown in FIG. 1, the NAND flash memory includes a memory cell array 1, a row decoder 2, a data input/output circuit 3, a voltage generator 4, a source line driver 5, a controller 6, and a sense amplifier 7.

1-1. Memory Cell Array 1

The memory cell array 1 includes blocks BLK0 to BLKs containing a plurality of nonvolatile memory cells MC (s is a natural number). Each of the blocks BLK0 to BLKs includes a plurality of NAND strings 10 in which the nonvolatile memory cells MC are connected in series. Each of the NAND strings 10 contains, for example, 64 memory cells MC and select transistors ST1, ST2.

The memory cell MC is capable of holding 2-level or multi-level data. The structure of the memory cell MC is an FG structure containing a floating gate (charge conducting layer) formed on a p-type semiconductor substrate via a gate dielectric film and a control gate on the floating gate via an inter-gate dielectric film. Incidentally, the structure of the memory cell MC may be of the MONOS type. The MONOS type is a structure having a charge accumulation layer (for example, a dielectric film) formed on a semiconductor substrate via a gate dielectric film, a dielectric film (hereinafter, referred to as a block layer) formed on the charge accumulation layer and having a higher dielectric constant than the charge accumulation layer, and further a control gate formed on the block layer.

The control gate of the memory cell MC is electrically connected to the word line WL, the drain thereof is electrically connected to a bit line BL, and the source thereof is electrically connected to the source line SL. The memory cell MC is an n-channel MOS transistor. The number of the memory cells MC is not limited to 64 and may be 128, 256, 512 or the like and the number thereof is not to be limited.

The memory cell MC shares the source and drain with the adjacent memory cells MC. Then, the memory cells MC are arranged between the select transistors ST1, ST2 so that current paths thereof are connected in series. The drain region on one side of the memory cells MC connected in series is connected to the source region of the select transistor ST1 and the source region on the other side is connected to the drain region of the select transistor ST2.

The control gates of the memory cells MC in the same row are commonly connected to one of the word lines WL0 to WL63 and the gate electrodes of the select transistors ST1, ST2 of the memory cells MC in the same row are commonly connected to select gate lines SGD1, SGS1 respectively. For simplification of description, the word lines WL0 to WL63 may simply be called the work line WL below when the word lines are not distinguished. The drains of the select transistors ST1 in the same column of the memory cell array 1 are commonly connected to one of the bit lines BL0 to BLn. Also, the bit lines BL0 to BLn will collectively be called the bit line BL below when the bit lines are not distinguished (n is a natural number). The sources of the select transistors ST2 are commonly connected to the source line SL.

Data is collectively written to a plurality of memory cells MC connected to the same word line WL and the unit is called a page. Further, data in the memory cells MC is collectively erased in block BLK units.

1-2. Threshold Distribution and Current Distribution of Memory Cell MC 1-2-1.

The threshold distribution of the memory cells MC will be described by using FIG. 2. FIG. 2 is a graph showing the number of memory cells MC on the vertical axis by taking the threshold distribution (voltage) on the horizontal axis. As shown in FIG. 2, each of the memory cells MC may hold, for example, 2-level data (1-bit data: two types of data of "1" and "0" in ascending order of threshold voltage Vth). The memory cell MC holds "1" data in an erase state (for example, a negative voltage) and is set to a positive threshold voltage by injecting a charge into the charge accumulation layer.

1-2-2.

Figure 3:
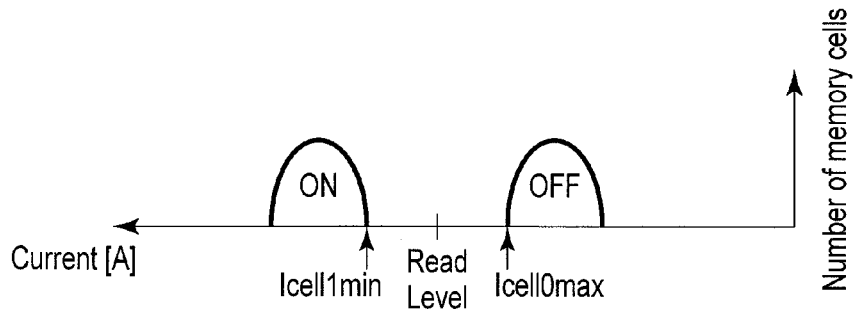
FIG. 3 is a conceptual diagram showing the threshold distribution of memory cells according to the first embodiment.

The current distribution of the memory cells MC will be described by using FIG. 3. FIG. 3 is a graph showing the number of memory cells MC on the vertical axis and the current distribution on the horizontal axis. As shown in FIG. 3, when, for example, 0 V is applied to a gate, a current Icell flows to the memory cell MC in an ON state (hereinafter, also called an ON cell) and a current Icell0 flows to the memory cell MC in an OFF state (hereinafter, also called an OFF cell). Thus, in a memory cell transistor MT, the value of flowing current changes depending on the ON or OFF state and the relationship Icell1>Icell0 holds.

The currents Icell1, Icell0 are each distributed with a fixed width. That is, these currents vary. Such variations are caused by variations in characteristics of the memory cell MC, variations in line width of the bit lines and the like.

The minimum value Icell1min of the current Icel1 flowing into the memory cell MC in the ON state is related as Icell1min>ReadLevel. The maximum value Icell0max of the current Icell0 flowing into the memory cell MC in the OFF state is related as Icell0max<ReadLevel. Incidentally, ReadLevel is a current value as a criterion for determining whether data is "0" or "1" by the sense amplifier 7.

1-3. Row Decoder 2

A peripheral circuit will be described by returning to FIG. 1.

The row decoder 2 decodes a block selection signal provided by the controller 6 during, for example, a read operation and selects the block BLK based on the result thereof. Next, the row decoder 2 transfers a read voltage to each word line WL in the selected block BLK. More specifically, the row decoder 2 transfers a selected read voltage (hereinafter, the voltage Vcgr) to the memory cell MC to be read and a non-elected read voltage (hereinafter, the voltage Vread) to the other memory cells MC. At this point, as will be described later, a voltage VDD is applied to the source line SL, for example, CELSRC. CELSRC corresponds to a node where a plurality of NAND strings are connected to the source line SL.

A positive high voltage is applied to the semiconductor substrate (well substrate) on which the memory cells MC are formed during erasing while the zero potential is transferred to all the word lines WL passing through the selected block BLK. The threshold of the memory cell MC is set to the negative side in accordance with the voltage applied to the well.

1-4. Data Input/Output Circuit 3

The data input/output circuit 3 outputs an address and command supplied from the host via an I/O terminal (not shown) to the controller 6. The data input/output circuit 3 also outputs write data to the sense amplifier 7 via a data line $D_{line}$. When outputting read data to the host, the data input/output circuit 3 receives data read by the sense amplifier 7 based on the control of the controller 6 via the data line $D_{line}$ and then outputs the data to the host via the I/O terminal.

1-5. Voltage Generator 4

Figure 4:
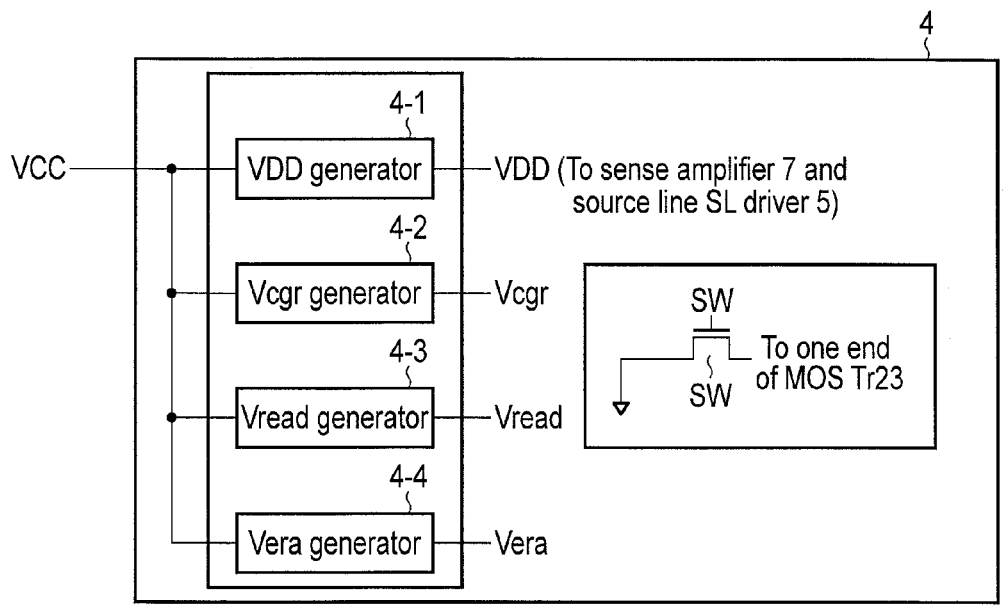
FIG. 4 is a configuration example of a voltage generator according to the first embodiment.

The voltage generator 4 will be described by using FIG. 4. As shown in FIG. 4, the voltage generator 4 includes a VDD generator 4-1, a Vcgr generator 4-2, a Vread generator 4-3, a Vera generator 4-4, and a switch SW to ground one end of a current path of a MOS transistor 23 in the sense amplifier 7 described later. The voltage generator 4 receives an external voltage (voltage Vcc, for example, 1.8 V) to generate a predetermined voltage according to the controller 6. More specifically, the VDD generator 4-1 generates, for example, the voltage VDD and supplies the voltage to the sense amplifier 7 and the source line driver 5. The Vcgr generator 4-2 and the Vread generator 4-3 generate the read voltages (the voltage Vcgr, the voltage Vread) and supply the voltages to the row decoder 2. Further, the Vera generator 4-4 generates an erase voltage (voltage Vera) and supplies the voltage to the well where the memory cells MC are formed.

The switch SW is a switch transistor SW in which one end of the current path is grounded and a signal sw is supplied to the gate. The switch SW is turned on when reading and one end of the current path of the MOS transistor 23 is thereby set to the ground potential.

1-6. Source Line Driver 5

The source line driver 5 according to the present embodiment supplies the voltage VDD supplied from the VDD generator 4-1 of the voltage generator 4 when data is read to the source line SL (CELSRC).

1-7. Control Unit 6

The controller 6 controls the operation of the entire NAND flash memory. That is, the controller 6 performs an operation sequence in a write operation, read operation, or erase operation based on the address and command provided by the host (not shown) via the data input/output circuit 3. More specifically, the controller 6 controls the timing of supplying a signal to each transistor constituting the sense amplifier 7, the timing of supplying the voltage VDD to the source line driver 5, and the amount of current flowing to the bit line BL.

Then, the controller 6 generates a block selection signal/column selection signal based on the address and operation sequence. The controller 6 outputs the block selection signal to the row decoder 2 and the column selection signal to the sense amplifier 7. The column selection signal is a signal that selects the column direction of the sense amplifier 7.

1-8. Sense Amplifier 7

The sense amplifier 7 writes write data transferred from the data input/output circuit 3 to the memory cell MC via the bit lie BL and also transfers data read from the memory cell MC to the data input/output circuit 3. The reading method of data in the present embodiment involves sensing a current Icell flowing from the source line SL toward the bit line BL by the sense amplifier 7 using an SFS method. The sense amplifier 7 in the present embodiment reads holding data from all the bit lines BL all at once.

As described above, the held data is determined by the current value in accordance with the threshold held by the memory cell MC. Next, the configuration of the sense amplifier 7 will be described.

2. Configuration of the Sense Amplifier 7

The configuration of the sense amplifier 7 will be described by using FIG. 5. The sense amplifier 7 includes n-channel MOS transistors 20 to 23, 25 to 30, 32 to 36, p-channel MOS transistors 37 to 40, a capacitor element 24, and a constant current source 50. The constant current source 50 includes a current source 51 and a MOS transistor 52. The threshold potential of a MOS transistor will be denoted below by attaching a reference numeral of the MOS transistor to a threshold potential Vth of the MOS transistor. For example, the threshold potential of a MOS transistor 21 is denoted as Vth21. The configuration of the sense amplifier 7 will be described below.

One end of the current path of a MOS transistor 20 is connected to the bit line BL and a signal BLS controlled by the controller 6 is supplied to the gate. The signal BLS is set to the "H" level for a read operation or write operation and to the "L" level for an erase operation, that is, the signal BLS is a signal that allows the bit line BL and the sense amplifier 7 to be connected.

Like the signal BLS supplied to the gate of the MOS transistor 20, signals supplied to the gate of each MOS transistor constituting the sense amplifier 7 and described below are also controlled by the controller 6.

One end of the current path of the MOS transistor 21 is connected to the other end of the current path of the MOS transistor 20, the other end thereof is connected to SCOM, and a signal BLC is supplied to the gate thereof. The signal BLC is a signal to clamp the bit line BL to a predetermined potential. If the signal BLC=(Vsen+Vth21) should be provided to the MOS transistor 20, the potential of the bit line BL is clamped to a voltage Vsen.

One end of the current path of a MOS transistor 22 is connected to SCOM, the other end thereof is connected to a node N2, and a signal BLX is supplied to the gate thereof. The node N2 is connected to the switch SW in the voltage generator 4 described above. That is, when the switch transistor SW is turned on, the node N2 is at the ground potential.

As will be described later, the potential of SCOM changes, as shown in FIG. 3, depending on the current Icell passed by the memory cell MC. More specifically, the potential of SCOM changes depending on which of a current driving force I of the memory cell MC passing Icell (the current driving force I when Icell1 is passed is denoted as $I_1$ and the current driving force I when Icell0 is passed is denoted as $I_0$ below) and a current driving force $I_{22}$ passed by the MOS transistor 22 is larger. The relationship $I_0 < I_{22} < I_1$ holds among the current driving force $I_0$, the current driving force $I_{22}$, and the current driving force $I_1$.

The description of the configuration will continue. The gate of the MOS transistor 22 is commonly connected to the gate of the MOS transistor 52. That is, a mirror circuit is formed by the MOS transistor 22 and the MOS transistor 52. Accordingly, the same current flows to the MOS transistor 52 and the MOS transistor 22 (hereinafter, the current flowing to the MOS transistor 22 will be called a current iFLT). A current from the current source 51 is supplied to one end of the current path and the gate of the MOS transistor 52 and the MOS transistor 52 pass the current iFLT in accordance with the potential difference between the gate and source.

One end of the current path of the MOS transistor 23 is connected to SCOM, the other end thereof is connected to SEN (detector), and the signal XXL (Vsen+Vth23+GB) is supplied to the gate thereof. The voltage GB is a preliminary voltage to reliably turn on the MOS transistor 23 when reading "0" data. This also applies to the voltage GB supplied to the gate of other MOS transistors.

A voltage relationship of the signal BLC>signal XXL holds between the signal BLC and the signal XXL. That is, when sensing, the relationship of a current driving force $I_{21}$>current driving force $I_{23}$ is established between current driving force I of the MOS transistor 21 and the MOS transistor 23 so that the current of the MOS transistor 21 is more preferentially passed than the current of the MOS transistor 23.

That is, if the signal XXL is set to the "H" level, charges are shared between SEN and SCOM in accordance with the potential of SCOM.

If the potential of SCOM should be the voltage (Vsen+GB) or higher, no charge sharing occurs and SEN maintains the "H" level.

If the potential of SCOM is less than the voltage (Vsen+GB), by contrast, charge sharing occurs and SEN makes a transition to the "L" level. The value of the signal XXL will be described later.

The description of the configuration will continue. A clock CLK is supplied to one electrode of the capacitor element 24 at a node N3 and the other electrode is connected to SEN. The clock CLK has a function to boost the potential of SEN.

One end of the current path of a MOS transistor 25 is connected to the node N3 and a signal SEN is supplied to the gate thereof. That is, the MOS transistor 25 is turned on or turned off in accordance with the potential of SEN. One end of the current path of a MOS transistor 26 is connected to the other end of the current path of the MOS transistor 25, the other end of the current path is connected to a node N4, and a signal STB is supplied to the gate thereof. These MOS transistors 25, 26 have a function to transfer read data to a latch (for example, SDL).

One end of the current path of a MOS transistor 27 is connected to SEN, the other end of the current path is connected to the node N4, and a signal BLQ (voltage (VDD+Vth27+GB)) is supplied to the gate thereof. The MOS transistor 27 has a function to charge a node SEN and further, a function to transfer operation data to the node SEN when a data operation is performed.

One end of the current path of a MOS transistor 28 is connected to SEN and a signal LSL is supplied to the gate thereof. One end of the current path of a MOS transistor 29 is connected to the other end of the current path of the MOS transistor 28, the other end of the current path is grounded (voltage VLSA), and the gate thereof is connected to the node N4. These MOS transistors 28, 29 are transistors to transfer operation data stored in a latch unit (for example, XDL) to the node SEN.

One end of the current path of a MOS transistor 30 is connected to the node N4, the other end thereof is connected to a node LAT_S, and a signal STL is supplied to the gate thereof.

The voltage VDD is supplied to one end of the current path of a MOS transistor 32, the other end of the current path is connected to one end of the current path of a MOS transistor 33 in the node N4, and a signal LPC(=voltage (Vth32+VDD+GB)) is supplied to the gate thereof. One end of the current path of a MOS transistor 33 is connected to the node N4, the other end of the current path is connected to DBUS (ground potential if necessary), and a signal DSW is supplied to the gate thereof. Incidentally, a wire to which the node N4 is connected may be called LBUS.

The voltage VDD supplied to one end of the current path of a MOS transistor 31 is a voltage generated by the voltage generator 4 (VDD generator 4-1). Charge sharing is prepared by supplying the voltage VDD to SEN via the MOS transistors 31, 32, 27 when reading.

One end of the current path of a MOS transistor 34 is connected to a node LAT_S, the other end of the current path is grounded, and the gate thereof is connected to a node INV_S. One end of the current path of a MOS transistor 35 is connected to the node INV_S, the other end of the current path is grounded, and the gate thereof is connected to the node LAT_S. One end of the current path of a MOS transistor 36 is connected to the node INV_S, the other end thereof is connected to the node N4, and a signal STI is supplied to the gate thereof. That is, a latch circuit SDL is constituted by the MOS transistors 34, 35, 38, 40 and the latch circuit SDL holds data of the node LAT_S.

The voltage VDD is supplied to one end of the current path of a MOS transistor 37 and a signal SLL is supplied to the gate thereof. One end of the current path of the MOS transistor 38 is connected to the other end of the current path of the MOS transistor 37, the other end of the current path is connected to the node LAT_S, and the gate thereof is connected to the node INV_S. The voltage VDD is supplied to one end of the current path of a MOS transistor 39 and a signal SLI is supplied to the gate thereof. One end of the current path of the MOS transistor 40 is connected to the other end of the current path of the MOS transistor 39, the other end of the current path is connected to the node INV_S, and the gate thereof is connected to the node LAT_S.

3. Voltage of Signal XXL

Figure 6:
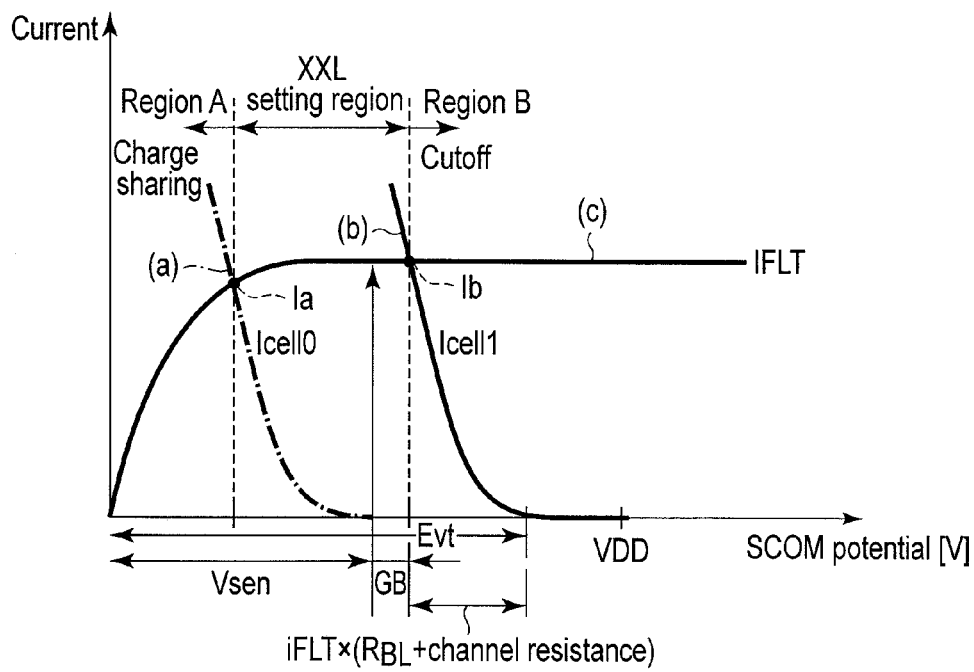
FIG. 6 is a conceptual diagram showing characteristics between a current flowing into the sense amplifier according to the first embodiment and a voltage and a setting range of a signal XXL.

Next, the signal Vsen supplied the signal XXL will be described using FIG. 6. The voltage Vsen needs to be set in accordance with the potential of SCOM that changes depending on Icell0 and Icell1. FIG. 6 is a graph showing current-voltage characteristics; the vertical axis is the current and the horizontal axis is the voltage.

The graph shows the current Icell0 (hereinafter, the A line) passed by the memory cell MC holding "0" data, the current Icell1 (hereinafter, the B line) passed by the memory cell MC holding "1", and current-voltage characteristics of the current iFLT (hereinafter, the C line).

When viewing characteristics of the memory cell MC, the horizontal axis is considered as the voltage supplied to the gate and when viewing characteristics of the MOS transistor 22, the horizontal axis is considered as the voltage supplied to the drain (SCOM) of the MOS transistor 22.

As shown in FIG. 6, no current flows when a voltage Evt is reached according to voltage-current characteristics shown by, for example, the B line. This means that, as described above, the voltage Evt appears in the source of the memory cell MC to which Icell is passed if 0 V is provided to the gate and the voltage Evt to the drain. That is, a potential difference of only the voltage Evt arises between the gate and source. If the voltage provided to the gate is the voltage Evt, the potential difference (potential difference between the gate and source) becomes zero and the current Icell1 does not flow.

Similarly, the same may be said about voltage-current characteristics shown by the A line. As is evident from FIG. 6, the difference from the B line is that the value of flowing current is smaller even if the same voltage as the voltage at which the memory cell MC passes Icell1 is supplied to the gate. That is, the current Icell0 has characteristics of being shifted to the left from those of the current Icell1. In contrast to these A and B lines, the current iFLT of the C line has characteristics that the current increases with the voltage provided to the gate of the MOS transistor 22 and is saturated at some point.

The intersection of the A line and the C line and the intersection of the B line and the C line become potentials of SCOM. These intersections are each denoted as Ia and Ib, and also the voltage at intersection Ia is denoted as Va and the voltage at intersection Ib is denoted as Vb. The relationship between the voltage Va or the voltage Vb and the voltage Vsen will be described below.

<Size Relation of the Voltage Va and the Voltage Vsen>

The sense amplifier 7 needs to cause the transition of the potential of SEN to the "L" level after charge sharing for the memory cell MC passing Icell0. That is, the potential of SCOM is the voltage Va and thus, the value of the voltage (Vsen+GB) needs to be made larger than the voltage Va. In other words, charge sharing is caused by setting the value of the voltage Va to a region A. If the value of the voltage (Vsen+α) is made smaller than the voltage Va, the MOS transistor 23 is cut off and no charge sharing occurs, leading to erroneous reading of data.

<Relationship Between the Voltage Vb and the Voltage Vsen>

When the signal XXL is set to the "H" level, the sense amplifier 7 needs to cause the MOS transistor 23 to maintain an off state and to make the potential of SEN maintain the "H" level for the memory cell MC passing Icell1. That is, the potential of SCOM is the voltage Vb and thus, the value of the voltage (Vsen+α) needs to be made smaller than the voltage Vb.

That is, as shown in FIG. 6, the voltage Vsen, the voltage Va, and the voltage Vb need to satisfy the relationship of the voltage Va<voltage Vsen<voltage Vb. If the value of the voltage (Vsen+α) is made larger than the voltage Vb of SCOM, the MOS transistor 23 is turned on, causing charge sharing. Thus, erroneous reading of data results. In other words, if the value of the voltage Vb is set to a region B, no charge sharing arises and no erroneous reading results. As shown in FIG. 6, the voltage Vb of SCOM when the current Icell1 flows is a value obtained by, as described above, subtracting the voltage corresponding to the resistance of the bit line BL and the on-resistance of the memory cell MC from the voltage Evt.

4. Each Signal During Read Operation and Potential of Each Node

Figure 7:
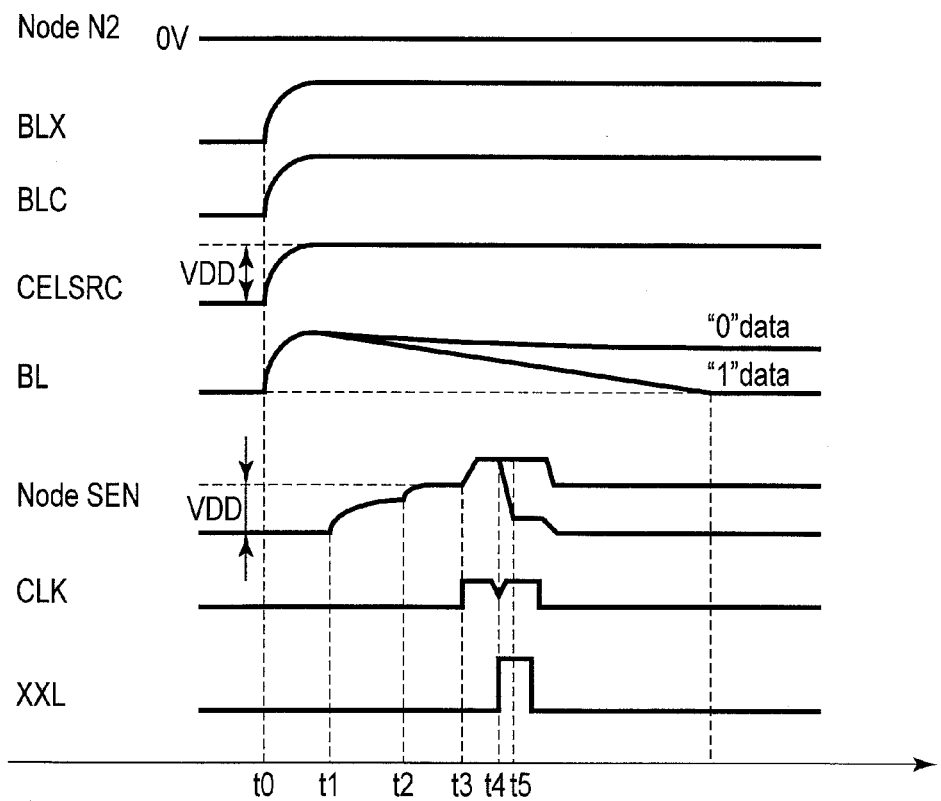
FIG. 7 is a time chart according to the first embodiment.

Next, each signal in the sense amplifier 7 and the operation of the potential of each node will be described by using a time chart in FIG. 7. FIG. 7 shows a time chart showing voltage changes of the node N2, the signal BLX, the signal BLC, CELSRC, the bit line BL, SEN, a signal CLK, and the signal XXL during a read operation.

As shown in FIG. 7, the signal BLX and the signal BLC are set to the "H" level at time t0. Also, the potential of the source line SL, that is, CELSRC rises to the voltage VDD due to the VDD generator 4-1. The node N2 is assumed to be at the ground potential.

Though not shown, next, predetermined voltages are provided to the word line WL and the select transistors ST1, ST2. As a result, if the NAND string 10 is conducting, the current Icell1 flows to the bit line BL and the potential of the bit line BL rises to the voltage Vdd after time t0. Then, the potential of the bit line BL is assumed to be a value obtained by subtracting the voltage corresponding to the resistance of the bit line BL and the resistance of the memory cell MC from the voltage VDD (denoted as "1" data in FIG. 7). The potential of the bit line BL will be described later.

If the NAND string 10 is not conducting, by contrast, Icell0 flows, but the current is weak, thus the potential of CELSRC is not transmitted to the bit line BL and the potential of the bit line BL rises once due to, for example, the wire capacity with adjacent bit lines BL, but falls with the passage of time (denoted as "0" data in FIG. 7).

Next, at time t1, the MOS transistor 31, the MOS transistor 34, and the MOS transistor 27 are each turned on and the potential of SEN rises through these MOS transistors. Then, at time t2, the potential of SEN reaches the voltage VDD. At time t3, the signal CLK is set to the "H" level and thus, the potential of SEN is boosted and the voltage thereof further rises.

Then, at time t4, the signal XXL is set to the "H" level and data held in the memory cell MC is sensed. When, as a result, charge sharing arises, the potential of SEN falls to the "L" level at time t5. When no charge sharing arises, by contrast, SEN remains at the "H" level even after time t5. Then, the boost by the signal CLK ends.

5. Read Operation

Next, the current and voltage of the NAND string 10 and the sense amplifier 7 during the above reading will be described more specifically by focusing on the NAND string 10 and the sense amplifier 7. The description is divided into "1" data reading and "0" data reading.

<"1" Data Reading>

A case when the memory cell MC holds "1" data will be described by using FIG. 8. In FIG. 8, the configuration of the memory string 10 and a portion of the sense amplifier 7 is shown and the source side of the memory string 10 is arranged on the upper side and the sense amplifier 7 is arranged on the lower side. In the present embodiment, it is assumed that data held by the memory cell MC connected to the word line WL63 (hereinafter, called the memory cell MC63) is read and the threshold of the memory cell MC63 is set as $Vth_{63}(<0)$.

In the read operation, as described above, while the source line driver 5 supplies the voltage VDD to CELSRC of the source line SL, the row decoder 2 supplies the voltage sgd1 to the select transistor ST1, the voltage sgs1 to the select transistor ST2, the voltage Vread to the word lines WL0 to WL62, and 0 V to the word line WL63. Then, as described above, the memory cell MC63 is turned on due to data held by the memory cell MC63 and the NAND string 10 is conducting (see FIG. 2). That is, the current Icell1 having a current driving force $I_{63}$ flows from the source line SL toward the sense amplifier 7. Thus, the potential of a node N10 (bit line BL) is set to the threshold voltage of the memory cell MC63, that is, the voltage $Vth_{63}$ (hereinafter, the potential appearing in the bit line BL may be called Evt). That is, if the threshold potential $Vth_{63}$ of the memory cell MC is, for example, −VDD, the voltage Evt becomes VDD.

This is because the voltage between the gate and source of the memory cell MC63 is at the same potential as the threshold voltage of the memory cell MC63, thus the potential of the source rises until the current Icell1 passed by the memory cell MC63 becomes zero. That is, because the potential of the word line WL63 is 0 V, the source of the memory cell MC63 rises up to the voltage $Vth_{63}$ so as to be at the same potential as the threshold voltage of the memory cell MC63. This may qualitatively be expressed as $Evt=(Vgs-Vth_{63})$. Vgs is the voltage between the gate and source of the memory cell MC63.

With the operation of the constant current source 50, the signal BLX is set to the "H" level and the MOS transistor 22 is turned on. Accordingly, the MOS transistor 22 passes the current iFLT toward the node N2. Thus, Icell1 flowing to the NAND string 10 when reading "1" data is limited to the current iFLT. The current driving force $I_{22}$ of the MOS transistor 22 in this case is, as described above, a value smaller than the current driving force $I_{63}$ of the MOS transistor 63.

The NAND string 10 through which the current iFLT flows and the bit line BL have a wire resistance (not shown) (hereinafter, referred to as the wire resistance $R_{BL}$) and also each of the memory cells MC0 to MC63 has an on-resistance. The on-resistance is, for example, a channel resistance between the source and drain. Therefore, the potential of SCOM is assumed to be a potential lowered by a voltage resulting from the wire resistance $R_{BL}$ and the on-resistance. That is, the potential of SCOM falls by ($R_{BL}$+on-resistance of memory cells MC0 to MC63)×iFLT. That is, the potential of SCOM is given by Evt−($R_{BL}$+on-resistance of memory cells MC0 to MC63)×iFLT.

In this state, the signal XXL is set to the "H" level. Because, as described above, the relationship of signal BLC>signal XXL holds, the current iFLT via the MOS transistor 21 and the MOS transistor 22 preferentially flows into the node N2 rather than the current passed by the MOS transistor 23. Thus, SEN retains the "H" level. At this point, as described above, the relationship of current driving force $I_{63}$>current driving force $I_{22}$ holds, thus the amount of current passed by the MOS transistor 63 into SCOM is larger than the amount of current passed by the MOS transistor 22. Thus, the potential of SCOM is equal to Vsen or higher. Therefore, no charge sharing arises even if the signal XXL is set to the "H" level and SEN maintains the "H" level. Accordingly, "1" reading of data is completed. Then, "1" data reading is completed after a predetermined data transfer operation.

Incidentally, the source of the MOS transistor 22 is grounded via a wire resistance (not shown).

<"0" Data Reading>

Next, data reading when the memory cell MC holds "0" data will be described by using FIG. 9. Also, in FIG. 9, a configuration similar to the configuration in FIG. 8 is shown. It is assumed, like the above case, that data held by the memory cell MC connected to the word line WL63 (hereinafter, called the memory cell MC63) is read and the threshold of the memory cell MC63 is set as $Vth_{63}(>0)$.

Like the above read operation, the source line driver 5 and the row decoder 2 supply predetermined voltages to the select transistors ST1, ST2, the word lines WL0 to WL62, and the word line WL63 and further, to the source line SL. Because the data held by the memory cell MC63 is "0", the memory cell MC 63 is turned off and though a weak current Icell0 flows, the memory string 10 is non-conductive (current pass through memory string 10 is not formed) and in a floating state (Hi-z) (see FIG. 3).

Next, the signal BLX is set to the "H" level by the constant current source 50 and the MOS transistor 22 is turned on. Accordingly, the MOS transistor 22 passes the current iFLT toward the node N2 (ground potential). Because the relationship of current driving force $I_{63}$<current driving force $I_{22}$ is satisfied in this case as described above, the potential of SCOM changes to the ground potential as a result of the discharge, and similarly, the bit line BL is also set to the ground potential.

Next, the signal XXL is set to the "H" level and the MOS transistor 23 is turned on. Because the potential of SCOM is zero, charge sharing arises between SEN and SCOM, and as a result of charges of SEN escaping to the node N2 or the bit line BL, the transition of the potential of SEN from the "H" level to the "L" level occurs. Then, "0" data reading is completed after a predetermined data transfer operation.

Effects According to the First Embodiment

A semiconductor memory apparatus according to the present embodiment may achieve effects in (1) and (2) below.

(1) A semiconductor memory apparatus according to the present embodiment may further lower a read determination threshold V01 of data to the negative side even if an external voltage Vcc is a low voltage source and also may read data from all bit lines BL at the same time.

Effects of the present embodiment will be described by citing comparative examples. In the comparative examples, the same reference numerals are used for the same configuration.

In Comparative Example Configuration 1, a configuration in which a current is passed from the sense amplifier 7 to the bit line BL, and at the same time, currents of all bit lines BL are detected is used for the description. In the configuration in this case, a voltage (Vblc+Vth21+CELSRC) is supplied to the gate of the MOS transistor 21 in FIG. 5 instead of the constant current source 50 and a voltage (Vblc+Vth22+CELSRC+BLC2BLX) is supplied to the gate of the MOS transistor 22. The voltage Vblc is a potential of the bit line BL when precharged. If CELSRC is raised to detect the threshold distribution on the negative side of the memory cell MC, the potentials of the signal BLC and the signal BLX also rise accordingly. If a sense operation is performed, that is, the signal XXL is set to the "H" level after the potential of CELSRC rises and the potential difference of the potential of the signal BLC and that of the node N2 exceeds Vth22 in the MOS transistor 22, a phenomenon in which charges accumulated in SEN flow via the MOS transistor 23, SCOM, and the MOS transistor 22 (this is called a back flow) occurs.

Thus, if, for example, the memory cell MC to be read holds "0" data, the NAND string 10 is made non-conductive and the bit line BL is charged up to, for example, the voltage VDD. That is, even if the potential of SCOM is at the "H" level, the transition of SCOM to the ground potential, that is, the "L" level occurs and charge sharing between SEN and SCOM is thereby caused, resulting in erroneous reading. Thus, an upper limit to the value of CELSRC supplied by the source line driver 5 exists so that no back flow arises in Comparative Example Configuration 1. If, for example, the external voltage is 1.8 V and one page corresponds to 2 KB, the value of CELSRC is set to a value half the external voltage or less. That is, the determination threshold V01 may be lowered to approximately −0.9 V or so.

However, there is a demand in the background to lower the determination threshold V01 to the negative side as much as possible. This is because charges of the charge accumulation layer of the memory cell MC holding, for example, "0" data escape to the outside with the passage of time and the threshold distribution of "0" data shown in FIG. 2 moves to the left side (negative side), and as a result, there is a concern that erroneous reading of data may occur due to closer distributions of "1" data and "0" data.

To solve the problem, that is, to increase the value of CELSRC, the SFS method may be adopted for the sense amplifier 7 configured to read data by detecting the voltage of the bit line BL (hereinafter, called Comparative Example Configuration 2). Though the value of CELSRC may be raised, all bit lines BL may not be selected at the same time according to this method and only even or odd bit lines BL may be selected. That is, if one page contains, for example, 2 KB, only half that data, 1-KB data, may be read.

In contrast, a semiconductor memory apparatus according to the present embodiment may satisfy both of the above requirements at the same time. That is, the determination threshold V01 of "0" and "1" data may be lowered to the negative side (more specifically, −(voltage VDD−current iFLT×($R_{BL}$+on-resistance of the memory cells MC0 to MC63))) while reading data from the memory cells MC connected to all the bit lines BL (for example, 2 KB). This is because the constant current source 50 and the SFS method are adopted and the node N2 that supplies one end of the current path of the MOS transistor 22 is grounded.

Figure 10:
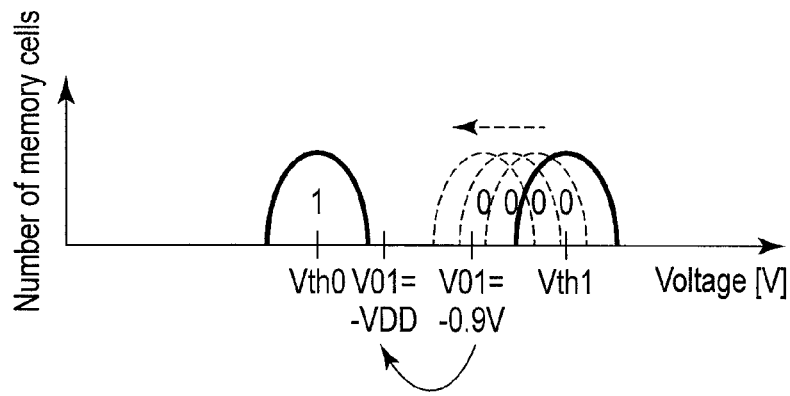
FIG. 10 is a conceptual diagram showing the threshold distribution of memory cells according to the first embodiment in which the threshold decreases with the passage of time.

That is, according to the present embodiment, no voltage resulting from CELSRC is supplied to the MOS transistor 22 even if the potential of CELSRC is raised to the internal voltage VDD (for example, 1.8 V) and thus, no back flow when reading will arise. Therefore, the potential of CELSRC may be raised to the internal voltage VDD. Such a situation is shown in FIG. 10. FIG. 10 shows a conceptual diagram of the threshold distribution of the memory cell MC shown in FIG. 2 and shows that the threshold voltage of the memory cell MC holding "0" data decreases with the passage of time. A case when the determination threshold V01 is, for example, as shown in FIG. 10, −0.9 will be considered. In this case, as indicated by a broken arrow line, the threshold distribution of "0" data moves toward the negative side beyond the determination threshold V01 with the passage of a certain time. Thus, there is a possibility that the sense amplifier 7 erroneously reads original "0" data as "1" data. According to the present embodiment, by contrast, because the determination threshold V01 may be set to −VDD, erroneous reading may be reduced even if the threshold distribution of "0" data moves toward the negative side.

Further, according to the present embodiment, the source side of the MOS transistor 22 is grounded. It is assumed that, for example, data is read from all bit lines BL at the same time by using the SFS system without grounding the node N2 in the sense amplifier 7 in Comparative Example Configuration 2. A case when, for example, "0" data is read from the center bit line BL of three bit lines BL and "1" data is read from the bit lines BL on both sides of the bit line BL is considered. In this case, the potential of the center bit line BL enters a floating state (Hi-z) and the potential of the bit lines BL on both sides becomes Evt. Thus, the potential of the bit line BL from which "0" data is read rises up to a potential resulting from the potential of the bit lines BL on both sides due to an inter-wire capacity, causing erroneous reading.

However, a semiconductor memory apparatus according to the present embodiment discharges the potential of the bit line BL by the current iFLT being passed to the node N2 by the MOS transistor 22. That is, even if the voltage of the bit line BL should rise due to coupling, data may be read from all the bit lines BL at the same time because a mechanism to discharge the potential is included.

The value of the current iFLT is a value smaller than the current Icell1 flowing to the NAND string 10 when "1" data is read, that is, a value such that the potential of SCOM does not become zero. This is because if the current driving force of the MOS transistor 25 is excessive, the potential of SCOM decreases, leading to erroneous reading.

(2) Power consumption may be reduced.

That is, a semiconductor memory apparatus according to the present embodiment may reduce the current flowing through a chip so that power consumption may be reduced. If the current Icell1 passed by the MOS transistor 22 through all bit lines BL should be passed without being limited to the current iFLT and there are many memory cells MC that allow a current larger than the current iFLT to flow, though the number thereof depends on the threshold of the memory cells MC holding "1" data, the amount of currents flowing through the chip at the same time increases due to the currents Icell1 passed by such memory cells MC.

In contrast, the sense amplifier 7 according to the present embodiment limits the current Icell1 to the current iFLT when reading "1" data. Because data is read at the same time from the memory cells MC connected to all bit lines BL in the present embodiment, the current may be reduced by the current (Icell1−iFLT)×number of bit lines BL from which "1" data is read. That is, the power consumption may be reduced.

Moreover, variations in the current iFLT from the sense amplifier 7 to the sense amplifier 7 may be eliminated. That is, a semiconductor memory apparatus according to the first embodiment may reduce variations in the potential difference Vgs (between the gate and the node N2) of the MOS transistor 22 from the sense amplifier 7 to the sense amplifier 7 because the node N2 is set to the ground potential. That is, variations in the current iFLT may be reduced and therefore, variations in potential of SCOM may be reduced and erroneous reading may be decreased. According to the method of reading data while passing a current from the sense amplifier 7 in the source SL direction, the side of the MOS transistor 22 functioning as a source is connected to the bit line BL. That is, the potential of the source of the MOS transistor 22 results from the potential of the bit line BL in accordance with the threshold of the memory cell MC to be read, thus different the current iFLTs are different the sense amplifiers 7. A semiconductor memory apparatus according to the first embodiment may reduce such variations.

First Modification

Next, a semiconductor memory apparatus according to a first modification of the first embodiment will be described by using FIGS. 11 and 12. In the first modification, a configuration to control the value of a current iFLT passed by a MOS transistor 22 of a sense amplifier 7 is provided in a constant current source 50. Accordingly, a determination threshold V01 is further lowered to the negative side when compared with the first embodiment. The configuration according to the first modification will be described below.

1. Configuration Example

A configuration example of the sense amplifier 7 according to the first modification and a read operation using the configuration example will be described by using FIGS. 11 and 12. The configuration excluding the constant current source 50 is the same as in the first embodiment, thus the description thereof is omitted.

Figure 11:
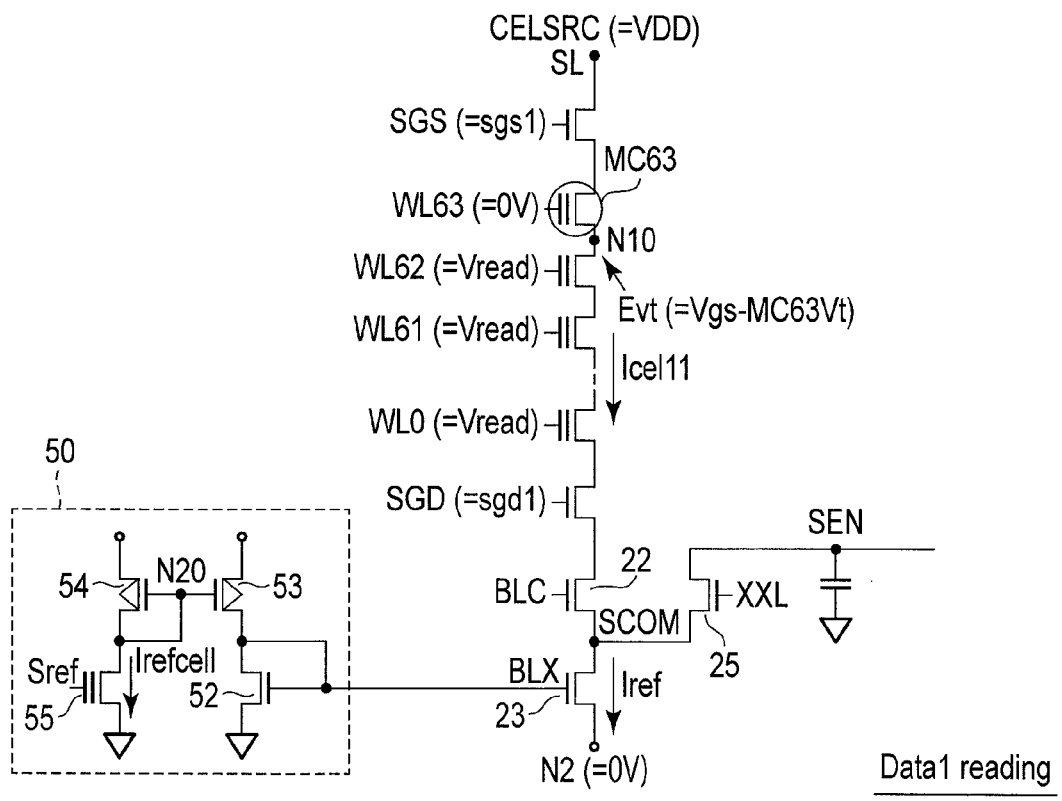
FIG. 11 is a conceptual diagram showing the sense amplifier and the NAND string potential when data according to a first modification of the first embodiment is read.

The constant current source 50 according to the first modification includes, as shown in FIG. 11, p-channel MOS transistors 53, 54 and a memory cell MC55, in addition to a MOS transistor 52. A voltage VDD is supplied to one end of the current path of the MOS transistor 53, the other end of the current path is connected to the other end of the MOS transistor 52, and the gate thereof is connected to a node N20. The voltage VDD is supplied to one end of the current path of the MOS transistor 54 and the other end of the current path and the gate thereof are connected to the node N20. That is, a mirror circuit is configured by the MOS transistors 53, 54. One end of the current path of a MOS transistor 55 is connected to the other end of the current path of the MOS transistor 54 at the node N20, the other end of the current path is grounded, a signal Sref is connected to the gate thereof by, for example, a controller 6, and the signal Sref is set to the zero potential when reading. When the zero potential is supplied to the gate, the MOS transistor 55 passes a current Irefcell. Incidentally, the signal Sref may be supplied also by a row decoder 2.

The threshold of the MOS transistor 55 is set as Vth55. Any value, for example, a value on the negative side of −VDD is set as the threshold of the MOS transistor 55 and the MOS transistor 54 passes a current in accordance with the threshold of the MOS transistor 55. In other words, the current passed by the MOS transistor 54 is controlled by the value of the threshold of the MOS transistor 55. The transition of the threshold setting of the MOS transistor 55 to the negative side may be caused by an erase operation and the amount of the transition may also be set by the erase operation.

In the above configuration, the MOS transistor 54 is repeatedly turned on and turned off in accordance with the level (the "L" level or "H" level) of the node N20. More specifically, the on and off states are repeated so that the node N20 (drain side) of the MOS transistor 54 maintains Vth54. That is, the current Irefcell is passed in the ON state and when the potential of the node N20 (drain side) of the MOS transistor 54 reaches Vth54 from the zero potential, the threshold Vth54 is supplied to the gate of the MOS transistor 54, thus the off state is entered and the current Irefcell is stopped. Then, the MOS transistor is in the off state and when the voltage of the node N20 (drain side) falls from Vth54 reached before, the MOS transistor 54 enters the ON state again to pass the current Irefcell.

By repeating the on and off states, the MOS transistor 54 and the MOS transistor 55 pass the current Irefcell. The current Irefcell flows also to a MOS transistor 23 when reading. The method of reading data held by the memory cell MC positioned further on the negative side by changing the threshold of the MOS transistor 55 will be described below.

2. Read Operation of Data

Next, a read operation of data will be described by using FIGS. 11 and 12. It is assumed that the threshold of the MOS transistor 55 is, for example, Vth55=−2.0 V. The MOS transistor 55 is assumed to pass the current Irefcell when the zero potential is provided to the gate of the MOS transistor 55. That is, the current Irefcell is a current that may be passed by the memory cell MC whose threshold is −2.0 V. As described above, the current iFLT passed by the MOS transistor 22 is a current of the same value as that of the current Irefcell. Therefore, reading with the determination threshold V01 set to −2.0 V is enabled depending on whether charges are shared by SEN and SCOM in accordance with the potential of SCOM. Thus, according to the first modification, the threshold further on the negative side may be read. It is assumed also here that a memory cell MC63 is to be read.

CELSRC supplied to the source line SL and the output voltage of the row decoder 2 are the same as in the first embodiment, thus the description thereof is omitted to focus on the potential of SCOM when reading.

As shown in FIGS. 11 and 12, a current of a current Icell0 or a current Icell1 (hereinafter, Icell_1a in CASE A and Icell_1b in CASE B) flows to a NAND string 10 in accordance with the threshold of the memory cell MC to be read in a read operation similar to the above one. That is, if the memory cell MC has a threshold moved further to the negative side, a current Icell has a correspondingly larger value. Data held by the memory cell MC63 is divided below depending on the presence/absence of charge sharing during the read operation.

CASE A: No Charge Sharing

When the value of a voltage (Vsen+α) is smaller than the potential of SCOM, no charge sharing arises between SEN and SCOM even if a signal XXL is set to the "H" level. Thus, SEN maintains the "H" level. Therefore, "1" data is read as the data held by the memory cell MC63. That the value of the voltage (Vsen+α) is smaller than the potential of SCOM means that a relationship of $I_{f63}>I_{f23}$ is established between a current driving force $I_{f63}$ of the MOS transistor MC63 passing the current Icella and a current driving force $I_{f23}$ of the MOS transistor 23 passing a current Iref. This is because if $I_{f63}>I_{f23}$ holds, the amount of charges flowing into SCOM becomes larger than the amount of charges discharged from SCOM. That is, the memory cell MC63 now focused on has a threshold capable of passing a current larger than the current Irefcell passed by the memory cell MC having the threshold of −2.0 V. In other words, the memory cell MC63 is positioned further on the negative side of −2.0 V (see the distribution of CASE A in FIG. 11). Therefore, data held by the memory cell MC further on the negative side may be read by setting the threshold of the memory cell MC55 to −2.0 V.

CASE B: Charges Shared

When the potential of SCOM is larger than the voltage (Vsen+α), charge sharing arises if the signal XXL is set to the "H" level. Thus, the transition of SEN from the "H" level to the "L" level occurs and as a result, "0" data is read as data held by the memory cell MC63. That the potential of SCOM is smaller than the value of the voltage (Vsen+α) means that a relationship of $I_{f63}<I_{f23}$ is established between the current driving force $I_{f63}$ of the MOS transistor MC63 passing the current Icellb and the current driving force $I_{f23}$ of the MOS transistor 23 passing the current Ire. This is the reverse of the above phenomenon and the amount of charges discharged from SCOM becomes larger than the amount of charges flowing into SCOM. That is, the memory cell MC63 now focused on has a threshold passing a current smaller than the current Irefcell passed by the memory cell MC having the threshold of −2.0 V. (See CASE B in FIG. 11.) In other words, the memory cell MC63 is positioned on the positive side of −2.0 V.

The memory cell MC having the threshold of −2.0 V is used as a reference cell, that is, the determination threshold V01 is set to −2.0 V and the value is used as a boundary to read "0" and "1" data, but the determination threshold V01 is not limited to the above value. That is, −2.0 V is a value cited as an example and other values may also be used. That is, by shifting the threshold of the reference cell further to the negative side, a read operation may be performed by shifting the determination threshold V01 to the negative side.

Effects According to the First Modification

A semiconductor memory apparatus according to the first modification may achieve an effect of (3) in addition to the effects in (1) and (2) above.

(3) The read determination threshold of data may further be lowered to the negative side.

A semiconductor memory apparatus according to the first modification includes, as described above, the constant current source 50 having the memory cell MC55 functioning as a reference cell. By setting the threshold of the memory cell MC55 in the constant current source 50 to any value by an erase operation, the determination threshold V01 to be read may further be shifted to the negative side. That is, a configuration according to the first modification may shift the determination threshold V01 further to the negative side even if an external voltage Vcc is a low voltage without the rate being limited by the external voltage.

Second Embodiment

Next, a semiconductor memory apparatus according to the second embodiment will be described by using FIGS. 13 to 15. A semiconductor memory apparatus according to the second embodiment sets the potential supplied to one end (node N2) of the current path of a MOS transistor 22 to a value (hereinafter, an intermediate potential) larger than the zero potential when discharging the potential of a bit line BL raised by coupling. The following description focuses on the bit line BL from which "0" data is read. The description of the same configuration as the above one is omitted.

1. Configuration Example 1-1. Voltage Generator 4

FIG. 13 shows a block diagram of a voltage generator 4 according to the second embodiment. As shown in FIG. 13, the voltage generator 4 further includes an NEG_SRC Driver 4-6 and a MOS transistor 4-7 functioning as a switch. The NEG_SRC Driver 4-6 generates an intermediate potential (for example, 1.0 V). The NEG_SRC Driver 4-6 supplies the generated intermediate potential to one end (node N2) of the current path of the MOS transistor 22 via the MOS transistor 4-7.

The MOS transistor 4-7 is a transistor that enables connection of output of the NEG_SRC Driver 4-6 and the node N2. That is, in the present embodiment, a switch transistor SW is turned off and the MOS transistor 4-7 is turned on to transfer the intermediate potential to the node N2.

2. Each Signal During Read Operation and Potential of Each Node

Next, each signal in a sense amplifier 7 according to the second embodiment and potential changes of each node including the bit line will be described. More specifically, a time chart of the node N2, a signal BLX, a signal BLC, CELSRC, the bit line BL, SEN, a signal CLK, and a signal XXL during the read operation is shown. The second embodiment is different from the first embodiment in that the potential of the node N2 is set to an intermediate potential when reading. Other operations are the same as those in the first embodiment, thus the description thereof is omitted.

A shown in FIG. 14, the NEG_SRC Driver 4-6 generates an intermediate voltage for the node N2 and supplies the intermediate voltage to the node N2. Thus, the potential of the node N2 after time t0 is set to the intermediate potential. Therefore, for example, the bit line BL from which "0" data is read reaches a voltage V0 at time t2' and remains at the same potential after t2'.

3. Read Operation

Next, a read operation of "0" data by the sense amplifier 7 will be described by using FIG. 15. It is assumed also here that a memory cell MC63 is to be read and an example in which the memory cell MC63 holds "0" data is shown. A voltage VDD supplied to a source line SL, that is, CELSRC and the output voltage of a row decoder 2 are the same as in the first and second embodiments, thus the description thereof is omitted.

As shown in FIG. 15, the memory cell MC63 is turned off by a read operation similar to the above one and a weak current Icell0 flows to a NAND string 10. Here, the NEG_SRC Driver 4-6 supplies an intermediate potential to one end of the current path of a MOS transistor 23, that is, the node N2. Because the MOS transistor 22 is sufficiently turned on by the signal BLX, the value of the potential of SCOM is the same as that of the potential of the node N2, that is, the intermediate potential. Though there is a small on-resistance in memory cells MC0 to MC62, the potential of a node N11 is assumed to be the potential of SCOM. That is, Vds (source-drain voltage) of the memory cell MC63 is set to a voltage (VDD-potential of SCOM).

Next, a sense operation is performed. That is, the signal XXL is set to the "H" level for charge sharing between SEN and SCOM. At this point, the value of the signal XXL is set to a voltage (Vth+Vsen+intermediate potential), adjusted to the rise the node N2. That is, the value of the signal XXL is set so that "0" data may be read as a result of charge sharing after the signal XXL is set to the "H" level. As a result, the potential of SEN changes from the "H" level to the "L" level to complete "0" data reading.

Effects According to the Second Embodiment

A semiconductor memory apparatus according to the second embodiment may achieve effects in (4) and (5) below, in addition to the effects (1) and (2) above.

(4) Vds related to the memory cell MC to be read may be reduced.

That is, a semiconductor memory apparatus according to the second embodiment includes a configuration that supplies an intermediate potential generated by the NEG_SRC Driver 4-6 to one end (node N2) of the current path of the MOS transistor 22. Therefore, the voltage between the drain and source of the selected memory cell MC63 may be reduced when "0" data is read and the so-called punch-through that causes a leak current to flow even if the gate is set to the "L" level may be inhibited. Thus, a semiconductor memory apparatus according to the second embodiment may reduce the short channel effect by decreasing the voltage Vds.

(5) The read operation may be made faster.

A semiconductor memory apparatus according to the second embodiment includes the NEG_SRC Driver 4-6 that generates an intermediate potential. By setting the intermediate potential to the node N2 by the NEG_SRC Driver 4-6 when reading, for example, the potential of the bit line BL reading "0" data may be made to reach a predetermined potential swiftly. That is, a faster read operation may be realized.

Third Embodiment

Next, the third embodiment will be described by using FIGS. 16 and 17. A semiconductor memory apparatus according to the third embodiment makes the voltage supplied to a signal XXL variable in accordance with the address of a memory cell MC to be read. The configuration according to the third embodiment will be described below. Incidentally, the signal XXL is made variable while a relationship of a signal BLC>signal XXL is satisfied.

1. Configuration 1-1. Control Unit 6

As shown in FIG. 16, a controller 6 according to the third embodiment includes a table 61. Table 61 shows the correspondence between address information (denoted as Selected word line WL/in FIG. 16) of the memory cell MC to be read, a distance of a bit line BL to a sense amplifier 7 calculated according to the address information, and a resistance in accordance with the length of the bit line BL.

More specifically, as shown in FIG. 16, the length of the bit line BL is $l_0$ and a resistance R of the bit line BL is $R_0$ for a selected word line WL0. Similarly, lengths of the bit lines BL and the resistances R in accordance with the lengths of the bit lines BL corresponding to word lines WL1 to WL1023 are shown.

When address information of the memory cell MC to be read is received from a data input/output circuit, the controller 6 refers to the correspondence table 61 in accordance with the address information to check a distance 1 and the resistance R of the bit line BL in accordance with the address information. Next, the controller 6 sets the value of the signal XXL in accordance with the resistance R.

2. Conceptual Diagram of Correspondence between Selected Word Line WL and Signal XXL Next, a conceptual diagram showing the relationship between a selected word line WL and the voltage supplied to the signal XXL will be described by using FIG. 17. FIG. 17 is a block diagram showing a memory cell array 1 and a partial configuration of the sense amplifier 7. A case when blocks BLK0 to BLK15 are provided in the memory cell array 1 will be described as an example.

Figure 17:
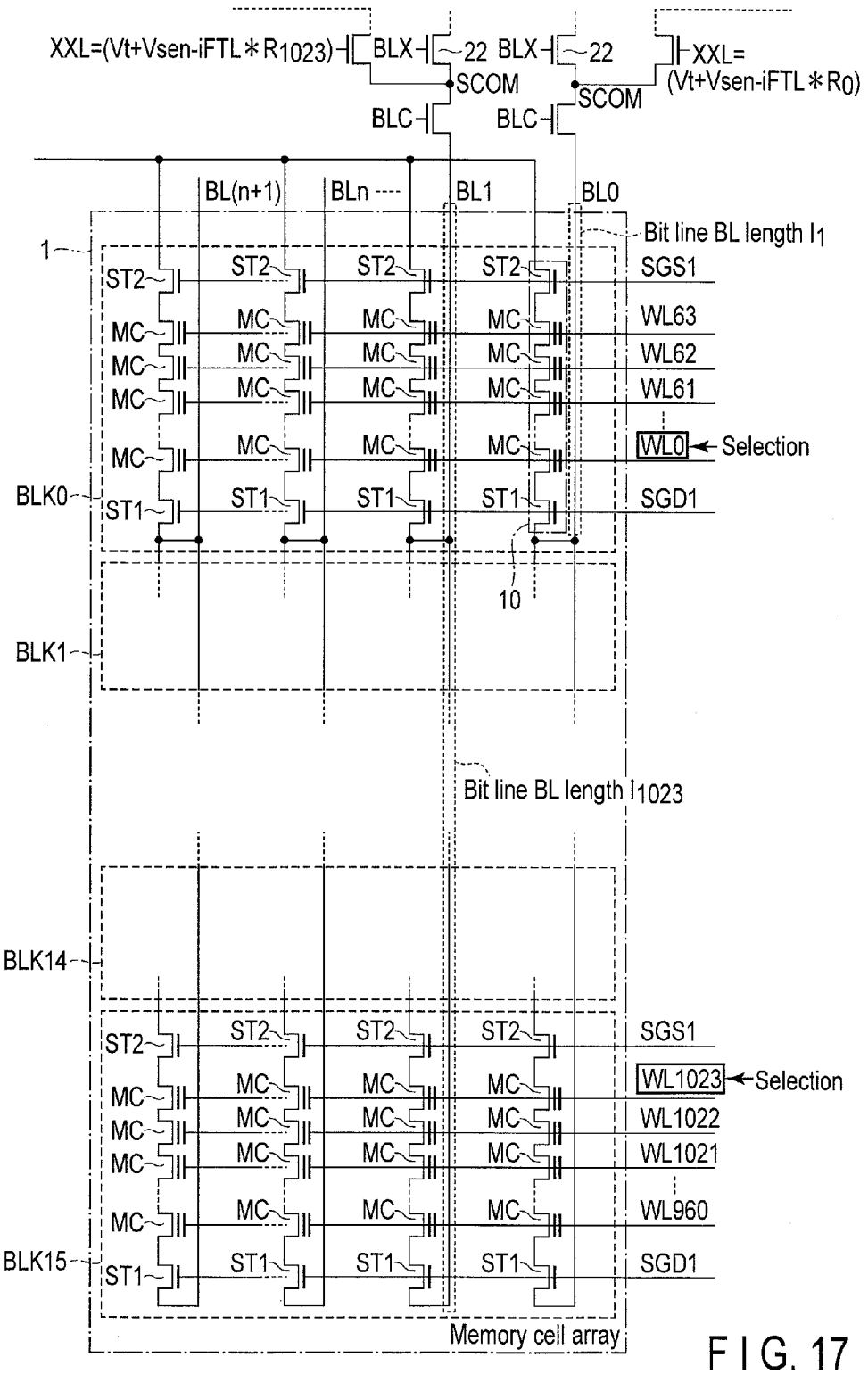
FIG. 17 is a conceptual diagram showing the relationship between a selected word line WL and the voltage supplied to the signal XXL according to the third embodiment.

In each of the blocks BLK0 to BLK15, as shown in FIG. 17, the word lines WL0 to WL63, WL64 to WL127, ..., WL960 to WL1023 are provided and also bit lines BL0 to BLn are formed by passing through the blocks BLK0 to BLK15. That is, the distance between the memory cell MC to be read and the sense amplifier 7 changes in accordance with the selected word line WL.

More specifically, if, as shown in FIG. 17, the word line WL0 is selected, the controller 6 refers to the table 61 to check values of the distance 1 of the bit line BL to the sense amplifier 7 and the resistance R. As a result of the reference, the distance $l=l_0$ and the resistance $R=R_0$, thus the controller 6 sets the value of the signal XXL in accordance with the resistance $R_0$.

More specifically, a current iFLT (the current passed by the memory cell MC is a current Icell) flows to the bit line BL when reading. Therefore, the voltage that decreases resulting from the length of the bit line BL is assumed to be given by the current iFLT×$R_0$. Accordingly, the controller 6 sets the value of the signal XXL from a voltage (Vth25+Vsen) to a voltage (Vth25+Vsen−iFLT×$R_0$).

When the word line WL1023 is selected, the controller 6 similarly refers to the table 61. In this case, the distance l=$l_{1023}$ and the resistance R=$R_{1023}$ as shown in the table 61, thus the controller 6 sets the value of the signal XXL in accordance with the resistance $R_{1023}$. More specifically, the controller 6 sets the value of the signal XXL from the voltage (Vth25+Vsen) to the voltage (Vth25+Vsen−iFLT×$R_0$).

As described in the second embodiment, the value of the signal XXL also changes in accordance with the potential of a voltage node N2. That is, when the word line WL0 is selected, XXL=voltage (Vth25+Vsen−iFLT×$R_0$+intermediate potential) is set and when the word line WL1023 is selected, XXL=voltage (Vth25+Vsen−iFLT×$R_{1023}$+intermediate potential) is set.

Effects According to the Third Embodiment

A semiconductor memory apparatus according to the third embodiment may achieve an effect in (6) below, in addition to the effects (1) and (2) above.

(6) Erroneous reading of data may be reduced.

As described above, data that is read is subject to the resistance of the bit line BL until the sense amplifier 7 is reached via the bit line BL and the voltage decreases below a predetermined voltage. Thus, when, for example, the memory cell MC1023 of the word line WL1023 is selected, the distance to the sense amplifier 7 becomes the longest. Thus, there is concern that though the read data is originally at a voltage corresponding to "0" data, data is erroneously read as "1" data due to a decreased voltage detected by SCOM.

In this respect, a semiconductor memory apparatus according to the third embodiment sets, as described above, the value of the signal XXL in accordance with address information, thus even if data is read from the memory cell MC1023 of the word line WL1023, erroneous reading may be reduced.

Fourth Embodiment

Next, a semiconductor memory apparatus according to the fourth embodiment will be described by using FIG. 18. A semiconductor memory apparatus according to the fourth embodiment reduces erroneous reading by turning off a MOS transistor 22 during sensing (during charge sharing) to raise the potential of SCOM when reading "1" data. The configuration of a sense amplifier 7 is the same as described in the first embodiment, thus the description thereof is omitted.

1. Time Chart

A read operation of data will be described by using FIG. 18. FIG. 18 is a time chart of the potential of a bit line BL from which "0" or "1" data is read, a signal XXL, and a signal BLX. The bit line BL from which "1" data is read is assumed to be, as shown in FIG. 18, a memory cell MC passing a current Icell_min. That is, a case when the memory cell MC to be read is distributed on the high potential side of the threshold distribution indicating "1" data is assumed.

At time t0, a predetermined voltage is transferred to a word line WL and a current Icell in accordance with data held by the memory cell MC is passed to a NAND string 10. Then, the bit line BL from which "0" is read falls to 0 V and the bit line BL from which "1" is read falls to a voltage V1 at time t1.

The bit line BL from which "1" is read falls to the voltage V1 because, as described above, the MOS transistor 22 has a relationship of, for example, current Icell_min<current iFLT between a current iFLT discharging the potential of SCOM and a current Icell_min. In this case, therefore, the potential of the bit line BL falls if the signal BLX="H" level is set at time t0.

Thus, the current iFLT is stopped by setting the signal BLX to the "L" level and turning off the MOS transistor 22 at time t1. Then, the potential of SCOM corresponding to the bit line BL from which "1" data is read rises. This is because, as described above, the current iFLT is stopped. Next, at time t2, charges are shared between SEN and SCOM. That is, a sense operation is performed by setting the signal XXL to the "H" level.

When charge sharing ends, the signal XXL is set to the "L" level again at time t3. Then, at time t4, the signal BLX is set to the "H" level.

Effects According to the Fourth Embodiment

A semiconductor memory apparatus according to the fourth embodiment may achieve an effect in (7) below, in addition to the effects (1) and (2) above.

(7) Erroneous reading of "1" data may be reduced.

A memory cell MC holding "1" data may have such a low Icell1 that the data may be determined to be "0" data, such as when the threshold of the memory cell MC is high. In such a case, there is concern that the data may erroneously be read as "0" data due to a decreased potential of SCOM after the current iFLT is passed. In this respect, a semiconductor memory apparatus according to the fourth embodiment may reduce erroneous reading without decreasing the potential of SCOM. This is because the signal BLX is turned off before charge sharing to raise the potential of SCOM. This may inhibit data from being erroneously read as "0" data.

Further, a semiconductor memory apparatus according to the fourth embodiment may retain a MOS transistor 25 in an ON state for a long time so that erroneous reading may be reduced. That is, if the signal XXL is made extremely short to shorten the time of charge sharing so that erroneous reading due to a decreased potential of SCOM by continuing to pass the current iFLT should not occur, the potential of SEN may not change to the "L" level because the time in which the signal XXL is in an ON state is short and charge sharing is insufficient even if the potential of the other bit lines BL are actually zero. In contrast, a semiconductor memory apparatus according to the fourth embodiment does not pass the current iFLT, thus there is no need to shorten an ON period of the signal XXL like the above case because the potential of SCOM rises even if the value of Icell1 is small.

Data is read from all bit lines BL at the same, thus the signal BLX in all the sense amplifiers 7 is turned off. Therefore, even if the potential of the bit line BL from which "0" data is read rises due to coupling resulting from the rise in potential of SCOM of the bit line BL from which "1" data is read, erroneous reading resulting therefrom does not occur. This is because the potential of SCOM of the bit line BL from which "1" data is read rises after the current iFLT is stopped, but the boost of the bit line BL from which "0" data is read caused by the potential rise is small.

Second Modification

Next, a semiconductor memory apparatus according to a modification (hereinafter, a second modification) of the fourth embodiment will be described by using FIG. 19. A semiconductor memory apparatus according to the second modification is different from that according to the fourth embodiment in that a signal BLX is set to the "L" level earlier.

The configuration is the same as that in the fourth embodiment, thus the description thereof is omitted.

1. Time Chart

A bit line BL, a signal XXL, and the signal BLX are shown on the vertical axis and time is shown on the horizontal axis. Only differences from FIG. 18 shown above will be described.

Figure 19:
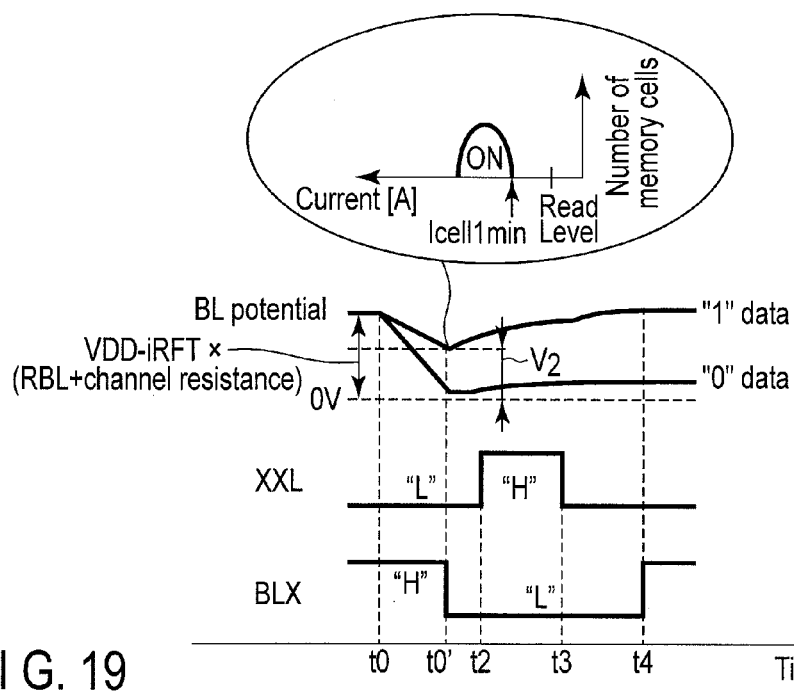
FIG. 19 and FIG. 20 are a time chart in a reading operation according to a modification of the fourth embodiment.

As shown in FIG. 19, the signal BLX is set to the "L" level at (time t0<) time t0' (<time t2). Accordingly, the potential of the bit line from which "1" data is read falls to a voltage V2 (>voltage V1) and then rises again. At time t0', the bit line BL from which "0" data is read is discharged by a current iFLT.

Effects According to the Second Modification

A semiconductor memory apparatus according to the second modification may reduce erroneous reading in accordance with magnitudes of current driving forces of a current Icell and the current iFLT flowing through the bit line BL from which, for example, "1" data is read.

That is, as described above, a memory cell MC holding "1" data may be, as shown in FIGS. 18 and 19, a memory cell MC positioned on the high voltage side of the threshold distribution and passing a current Icell1_min. In such a case, the current driving force passing the current iFLT is larger and the potential of the bit line BL is discharged, inviting erroneous reading of data.

In a semiconductor memory apparatus according to the second modification, by contrast, the potential of SCOM may be maintained at or above the voltage V2 by setting the signal BLX to the "L" level before the potential of the bit line BL falls and erroneous reading occurs. Accordingly, erroneous reading of data may be reduced.

Third Modification

Next, a semiconductor memory apparatus according to a modification (hereinafter, a third modification) of the fourth embodiment will be described by using FIG. 20. A semiconductor memory apparatus according to the third modification is different from the above embodiments in that a voltage (Evt+α) is supplied to CELSRC. The configuration of the third modification is the same as that in the above embodiments, thus the description thereof is omitted and a read operation will be described.

1. Time Chart

A read operation of "0" data by a sense amplifier 7 will be described by using FIG. 20. Further, it is assumed here that a memory cell MC63 is to be read and an example in which the memory cell MC63 holds "0" data is shown. Excluding the voltage supplied to a source line SL, that is, CELSRC, as described above, the output voltage of a row decoder 2 and the operation of each signal are the same, thus the description thereof is omitted.

Figure 20:
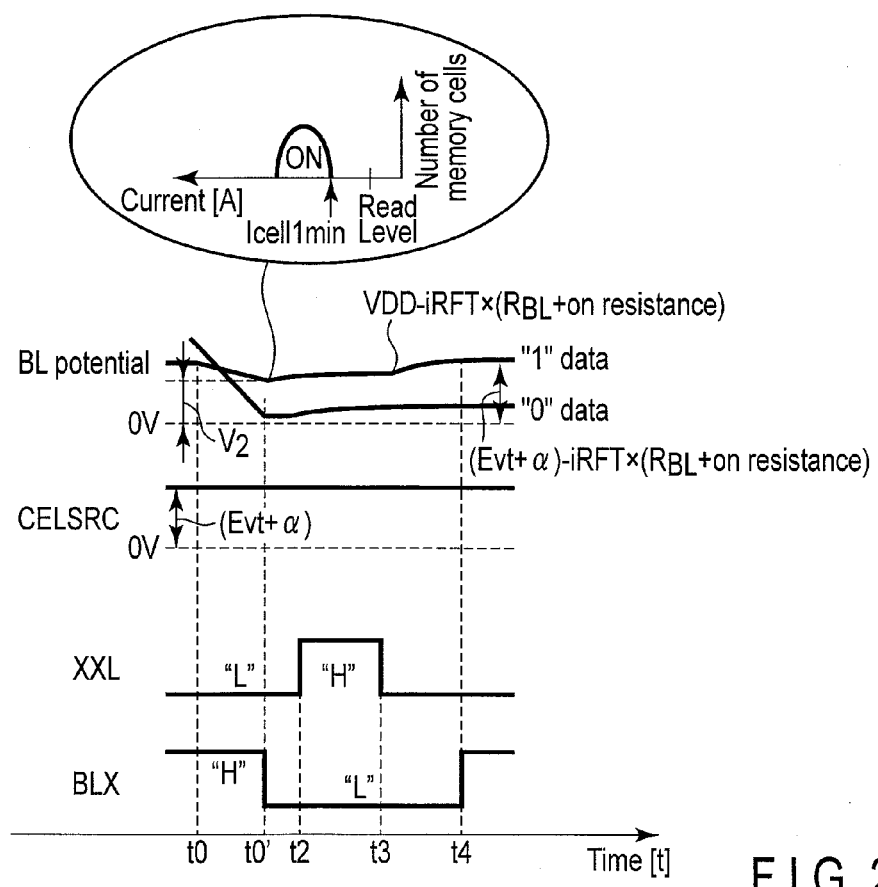

As shown in FIG. 20, a signal BLX is set to the "L" level after time t0' and if the rise in voltage occurs in an adjacent bit line BL from which "1" data is read, the potential of the bit line BL from which "0" data is read accordingly rises, due to coupling. In the third modification, the voltage (Evt+α) is supplied to the potential of CELSRC. Thus, at the time t4, the rise in potential of the bit line BL from which "1" data is read is assumed to be given by a voltage $(Evt+\alpha)-(R_{BL}+on\text{-}resistance)\times iFLT$ and the potential of the bit line BL from which "0" data is read is set to a value in accordance with the potential of the bit line BL from which "1" data is read. The voltage Evt is the threshold voltage of a memory cell MC to be read and is a value smaller than a voltage VDD.

Effects According to the Third Modification

A semiconductor memory apparatus according to the third modification may reduce erroneous reading of data accompanying the rise in voltage of the bit line BL from which "1" data is read. That is, in a semiconductor memory apparatus according to the third modification, the voltage (Evt+α) <VDD is supplied to CELSRC. Thus, the voltage appearing in the source of the memory cell MC to be read when "1" data is read is assumed to be the voltage Evt or the voltage (Evt+α). That is, the potential of the bit line BL from which "1" data is read is assumed to be given by a voltage $((Evt+\alpha)-(R_{BL}+on\text{-}resistance)\times iFLT)$ even if the signal BLX is set to the "L" level and the potential of the bit line BL (SCOM) rises. That is, even if the potential of the bit line BL from which "0" data is read rises due to coupling accompanying the rise in voltage of the bit line BL from which "1" data is read, the voltage supplied to CELSRC is smaller than the voltage VDD. Therefore, the potential of the bit line BL from which "0" data is read will not rise to the extent that causes erroneous reading.

Fifth Embodiment

Next, a semiconductor memory apparatus according to the fifth embodiment will be described by using FIG. 21. FIG. 21 is a circuit diagram of a sense amplifier 7 and a conceptual diagram that measures threshold variations of a MOS transistor 22. This is because variations of the MOS transistor 22 lead to variations of a current iFLT obtained by a mirror circuit with a constant current source 50.

1. Configuration Example

As shown in FIG. 21, the sense amplifier 7 further includes an XDL 60 and a DTCT 70. Here, the path where Icell_min is measured is focused on, thus only the configuration related to the measurement will be described, with the remaining description omitted.

The DTCT 70 includes n-channel MOS transistors 71 to 73. One end of the current path of the MOS transistor 71 is connected to a wire DBUS and the gate thereof is connected to a node N5. One end of the current path of the MOS transistor 72 is connected to the other end of the current path of the MOS transistor 71 and a signal ICEL is supplied to the gate thereof. Also, one end of the current path of the MOS transistor 73 is connected to the other end of the current path of the MOS transistor 72, the gate thereof is connected to a node N6, and the other end of the current path is connected to an external device that measures Icell_mon.

In this configuration, the current Icell_mon is passed toward a node N2 by turning on each of the MOS transistors 73, 72, 71, a MOS transistor 27, a MOS transistor 23, and the MOS transistor 22. That is, the current Icell_mon flowing to the MOS transistor 22 is measured by an external device via the MOS transistors 73, 72, 71, the wire DBUS, the MOS transistor 27, SEN, the MOS transistor 23, SCOM, and the MOS transistor 22.

Sixth Embodiment

Next, a semiconductor memory apparatus according to the sixth embodiment will be described by using FIG. 22. A semiconductor memory apparatus according to the present embodiment sets a signal SGS to the "L" level with the same timing as a signal XXL in, for example, FIG. 18.

The configuration in the sixth embodiment is the same as that in the above embodiments, thus the description thereof is omitted and a read operation will be described.

1. Time Chart

A read operation of "0" data by a sense amplifier 7 will be described by using FIG. 22. It is assumed also here that a memory cell MC63 is to be read and an example in which the memory cell MC63 holds "0" data is shown.

Figure 22:
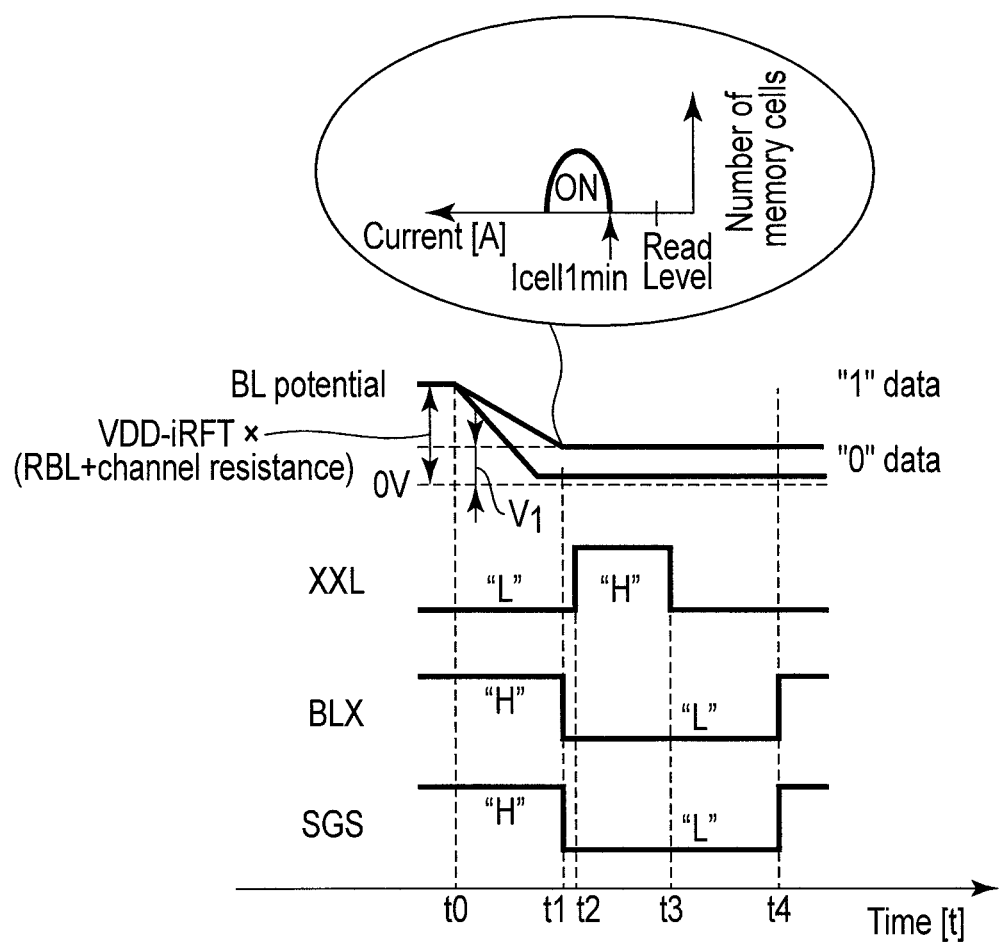
FIG. 22 is a time chart according to the sixth embodiment.

As shown in FIG. 22, the transition of the signal SGS to the "L" level is caused to take place with the same timing as the transition of a signal BLX to the "L" level at time t1. Then, the voltage supply from a source line SL stops. Therefore, a bit line BL from which "1" data is read does not rise and maintains, for example, a voltage V1.

Effects According to the Sixth Embodiment

A semiconductor memory apparatus according to the sixth modification may reduce erroneous reading of data by a bit line BL from which "0" data is attempted to be read. This is because the potential of the bit line BL from which "1" data is read does not rise, thus when, for example, the adjacent bit line BL reads "0" data, no coupling between the adjacent bit lines BL arises.

The first to sixth embodiments and the first to third embodiments described above may freely be combined and effects described above may also be obtained by combined embodiments. As an example, for example, the transition of the signal SGS to the "L" level is caused to take place with the same timing as the signal BLX in the sixth embodiment, but the timing is not limited to FIG. 18 and may also be applied to cases of FIGS. 19 and 20.

Each embodiment is applicable to a three dimensional multilayered NAND flash memory. Furthermore, a structure of the memory cell array is not limited as above description.

A memory cell array formation may be disclosed in U.S. patent application Ser. No. 12/532,030 filed on Mar. 23, 2009. U.S. patent application Ser. No. 12/532,030, the entire contents of which are incorporated by reference herein.

Furthermore A memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore A memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore A memory cell array formation may be disclosed in U.S. patent application Ser. No. 12/407,403 filed on Mar. 19, 2009. U.S. patent application Ser. No. 12/407,403, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory apparatus comprising:
a memory cell array including a NAND string, the NAND string including a memory cell;
a source connected to the NAND string, a source voltage being supplied to the source;
a bit line connected to the NAND string;
a sense amplifier including a first transistor, one end of a current path of the first transistor being connected to a first node, another end of the current path of the first transistor being connected to a second node, an internal voltage being supplied to the second node, the internal voltage being smaller than the source voltage; and
a current source circuit configured to output a first voltage to a gate of the first transistor, the first voltage being smaller than the internal voltage;
wherein when data held by the memory cell is read, the first transistor limits a first current from the source to the sense amplifier based on a threshold voltage of the memory cell to be read while a second voltage is supplied to the source.

2. The apparatus according to claim 1, wherein the second node is at a zero voltage.

3. The apparatus according to claim 1, wherein the voltage of the second node is raised to decrease a voltage between a drain and the source of the memory cell to be read.

4. The apparatus according to claim 2, further comprising:
a detector configured to detect the read data; and
a transfer transistor configured to transfer the voltage of the first node to the detector,
wherein a voltage supplied to a gate of the transfer transistor is a value in accordance with current-voltage characteristics of the first current and a second current.

5. The apparatus according to claim 3, further comprising:
a detector configured to detect the read data; and
a transfer transistor configured to transfer the voltage of the first node to the detector, wherein a voltage supplied to a gate of the transfer transistor is a value in accordance with current-voltage characteristics of the first current and a second current.

6. The apparatus according to claim 1, wherein the NAND string includes a first memory cell and a second memory cell, one of the first memory cell and the second memory cell being selected, and when the data is read, a third voltage is supplied to the first memory cell and a fourth voltage is supplied to the second memory cell.

7. A semiconductor memory apparatus comprising:
a memory cell array including a NAND string, the NAND string including memory cells;
a bit line connected to the NAND string; and
a sense amplifier including a first transistor, one end of a current path of the first transistor being connected to a first node, another end of the current path of the first transistor being connected to a second node, an internal voltage being supplied to the second node;
wherein:
the sense amplifier reads a voltage of the first node by turning on the first transistor by applying a first voltage to a source of the NAND string while transferring a read voltage to gates of the memory cells constituting the NAND string,
a source voltage is supplied to the source,
the internal voltage is smaller than the source voltage,
the second node is at a ground voltage,
the first node is a third voltage or a fourth voltage higher than the third voltage according to a characteristic of the memory cell, and the first transistor is supplied to "L" when the voltage of the first node falls to the third voltage or less.

8. A semiconductor memory apparatus comprising:
a memory cell array including a NAND string, the NAND string including memory cells;
a bit line connected to the NAND string; and
a sense amplifier including a first transistor, one end of a current path of the first transistor being connected to a first node, another end of the current path of the first transistor being connected to a second node, an internal voltage being supplied to the second node;
wherein:
the sense amplifier reads a voltage of the first node by turning on the first transistor by applying a first voltage to a source of the NAND string while transferring a read voltage to gates of the memory cells constituting the NAND string,
a source voltage is supplied to the source,
the internal voltage is smaller than the source voltage,
the second node is at a second voltage which is higher than a ground voltage and lower than the first voltage,
the first node is a third voltage or a fourth voltage higher than the third voltage according to a characteristic of the memory cell, and
the first transistor is supplied to "L" when the voltage of the first node falls to the third voltage or less.

9. The apparatus according to claim 7, further comprising:
a detector configured to detect read data held by the memory cells; and
a transfer transistor configured to transfer the voltage of the first node to the detector,
wherein a voltage supplied to a gate of the transfer transistor is a value in accordance with current-voltage characteristics of a first current or a second current and a third current passed by the first transistor.

10. The apparatus according to claim 8, further comprising:
a detector configured to detect read data held by the memory cells; and
a transfer transistor configured to transfer the voltage of the first node to the detector, wherein
a voltage supplied to a gate of the transfer transistor is a value in accordance with current-voltage characteristics of a first current or a second current and a third current passed by the first transistor.

11. A semiconductor memory apparatus comprising:
a memory cell array including a NAND string, the NAND string including a memory cell;
a source connected to the NAND string, a source voltage being supplied to the source;
a bit line connected to the NAND string;
a current source circuit configured to include a reference cell having a negative threshold and passing a first current; and
a sense amplifier including a first transistor, one end of a current path of the first transistor being connected to a first node, another end of the current path of the first transistor being connected to a second node, the first transistor configuring a mirror circuit together with the reference cell, an internal voltage being supplied to the second node, the internal voltage being smaller than the source voltage.

12. The apparatus according to claim 11, wherein the second node is at a zero voltage.

13. The apparatus according to claim 11, wherein whether the first node shares charges is decided based on whether a threshold of the memory cell from which data is attempted to be read is larger than the negative threshold of the reference cell.

14. The apparatus according to claim 11, wherein a determination threshold to read data held by the memory cell is shifted by varying the negative threshold of the reference cell.

15. The apparatus according to claim 11, wherein the voltage of the second node is raised to decrease a voltage between a drain and the source of the memory cell to be read.

* * * * *